US009722651B2

(12) United States Patent
Goela et al.

(10) Patent No.: US 9,722,651 B2
(45) Date of Patent: Aug. 1, 2017

(54) ADAPTIVE CHANNEL CODING USING POLARIZATION

(71) Applicant: QUALCOMM Incorporated, San Diego, CA (US)

(72) Inventors: Naveen Goela, Berkeley, CA (US); Venkatesan Nallampatti Ekambaram, Hillsboro, OR (US); Rahul Tandra, San Diego, CA (US); Joseph Binamira Soriaga, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/826,742

(22) Filed: Aug. 14, 2015

(65) Prior Publication Data

US 2016/0204811 A1 Jul. 14, 2016

Related U.S. Application Data

(60) Provisional application No. 62/101,864, filed on Jan. 9, 2015.

(51) Int. Cl.
*H04K 1/10* (2006.01)
*H04B 1/12* (2006.01)
(Continued)

(52) U.S. Cl.
CPC ......... *H04B 1/123* (2013.01); *H03M 13/1111* (2013.01); *H03M 13/1191* (2013.01);
(Continued)

(58) Field of Classification Search
CPC ... H04L 1/0009; H04L 1/0057; H04L 1/0061; H03M 13/1102; H03M 13/13;
(Continued)

(56) References Cited

U.S. PATENT DOCUMENTS

| | | | | |
|---|---|---|---|---|
| 2013/0117344 | A1 | 5/2013 | Gross et al. | |
| 2014/0169492 | A1 * | 6/2014 | Mahdavifar | H03M 13/13 375/267 |

(Continued)

OTHER PUBLICATIONS

Arikan "channel polarization: a method for constructing capacity-achieving codes for symmetric binary-input memoryless channels"; IEEE transaction on information theory, vol. 55, No. 7, Jul. 2009, pp. 3051-3073.*

(Continued)

*Primary Examiner* — Rahel Guarino
(74) *Attorney, Agent, or Firm* — Liem T. Do

(57) ABSTRACT

Methods, systems, and devices are described for wireless communications at a wireless device. A wireless device may adaptively select a parity check matrix to increase the reliability of signal transmission by adapting to different channel statistics and channel types (e.g., erasure channels, channels with additive white Gaussian noise, and channels with discrete or continuous alphabets). For example, polarization codes (i.e., codes based on rows of a polarization matrix) may be used to construct parity check matrices "on-the-fly" given an estimation of dynamic channel conditions or diverse channel structures. The channel may be decomposed into polarized sub-channels corresponding to the polarization codes, and mutual information profiles may be determined for each of the polarized sub-channels. The parity check matrix corresponding to the polarization codes may be constructed based on the mutual information profile of all polarized sub-channels. The wireless device may encode or decode data based on the constructed parity check matrix.

30 Claims, 14 Drawing Sheets

Identify a channel structure for a wireless channel — 1105

Generate a set of mutual information profile parameters corresponding to a set of polarized subchannels based on the identified channel structure — 1110

Select a plurality of polar transform sequences based on the set of mutual information profile parameters — 1115

Encode or decode a block of information based on the selected plurality of polar transform sequences — 1120

1100

(51) Int. Cl.
*H04L 1/00* (2006.01)
*H04B 7/0413* (2017.01)
*H03M 13/11* (2006.01)
*H03M 13/13* (2006.01)

(52) U.S. Cl.
CPC .......... *H03M 13/13* (2013.01); *H04B 7/0413* (2013.01); *H04L 1/0009* (2013.01); *H04L 1/0041* (2013.01); *H04L 1/0057* (2013.01)

(58) Field of Classification Search
CPC ......... H03M 13/1151; H03M 13/1154; H03M 13/116; H03M 13/1174
USPC ........ 375/260, 264; 714/781, 714, 851, 758, 714/782, 801
See application file for complete search history.

(56) References Cited

U.S. PATENT DOCUMENTS

| | | | | |
|---|---|---|---|---|
| 2014/0208183 | A1* | 7/2014 | Mahdavifar ........ | H03M 13/296<br>714/755 |
| 2015/0026543 | A1 | 1/2015 | Li et al. | |

OTHER PUBLICATIONS

Arikan, "Channel Polarization: a Method for Constructing Capacity-Achieving Codes for Symmetric Binary-Input Memoryless Channels," IEEE Transactions on Information Theory, vol. 55, Issue 7, Jul. 2009, pp. 3051-3073, XP_11262510A, Institute of Electrical and Electronics Engineers.

Guo et al., "Fixed-threshold Polar Codes," 2013 IEEE International Symposium on Information Theory Proceedings (ISIT), Istanbul, Jul. 7-12, 2013, pp. 947-951, XP_32497285A, Institute of Electrical and Electronics Engineers.

ISA/EPO, Partial International Search Report of the International Searching Authority, Int'l Appl. No. PCT/US2016/012639, Apr. 1, 2016, European Patent Office, Rijswijk, NL, 6 pgs.

Stolte, Rekursive Codes mit der Plotkin-Konstruktion and ihre Decodierung, D17 Darmstädter Dissertation, Jan. 1, 2002, 151 pgs. (in particular, pp. 13-30), XP_055241445A, URL:http://tuprints.ulb.tu-darmstadt.de/epda/000183/stolte.pdf, Techn. Universiťat, Diss., 2002 (Nicht f. d. Austausch)—Darmstadt.

Zhang Y., et al., "Polar-LDPC Concatenated Coding for the AWGN Wiretap Channel," IEEE Communications Letters, vol. 18 (10), Oct. 2014, pp. 1683-1686.

ISA/EP, International Search Report and Written Opinion of the International Searching Authority, Int'l Appl. No. PCT/US2016/012639, Jul. 25, 2016, European Patent Office, Rijswijk, NL, 20 pgs.

Park et al., "Polar Codes for $q$-Ary Channels, $q=2^r$," IEEE Transactions on Information Theory, Feb. 2013, pp. 955-969, vol. 59, Iss. 2, IEEE Press Piscataway, NJ, USA.

Wang et al., "On the Polar Codes for MIMO," 2013 International Conference on Wireless Communications & Signal Processing (WCSP), Hangzhou, China, Oct. 24-26, 2013, 5 pgs., DOI: 10.1109/WCSP.2013.6677268, Institute of Electrical and Electronics Engineers.

* cited by examiner 100
110
115
125
130
132
134
105

ADAPTIVE CHANNEL CODING USING POLARIZATION

CROSS REFERENCES

The present Application for patent claims priority to U.S. Provisional Patent Application No. 62/101,864 by Goela et al., entitled "Adaptive Channel Coding Using Polarization," filed Jan. 9, 2015, assigned to the assignee hereof, and expressly incorporated by reference herein.

BACKGROUND

Field of Disclosure

The following relates generally to wireless communication, and more specifically to adaptive channel coding using polarization.

Description of Related Art

Wireless communications systems are widely deployed to provide various types of communication content such as voice, video, packet data, messaging, broadcast, and so on. These systems may be multiple-access systems capable of supporting communication with multiple users by sharing the available system resources (e.g., time, frequency, and power). Examples of such multiple-access systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system).

A wireless multiple-access communications system may include a number of base stations, each simultaneously supporting communication for multiple communication devices, which may be otherwise known as user equipment (UEs). A base station may communicate with the communication devices on downlink channels (e.g., for transmissions from a base station to a UE) and uplink channels (e.g., for transmissions from a UE to a base station).

In some cases, a wireless device may encode data using a parity matrix to increase the reliability of a communication link. In some cases, the parity check matrix may be fixed (i.e. a predetermined low-density parity check matrix (LDPC)) and may be calibrated for a specific signal-to-noise ratio (SNR) regime with a target error-floor. However, a fixed parity matrix may not be efficient over a diverse range of noisy channel types.

SUMMARY

Systems, methods, and apparatuses for adaptive channel coding using polarization are described. A wireless device may adaptively select a parity check matrix to increase the reliability of signal transmission by adapting to different channel statistics and channel types (e.g., erasure channels, channels with additive white Gaussian noise, and channels with discrete or continuous alphabets). For example, polarization codes (i.e., a code based on rows of a polarization matrix) may be used to construct parity check matrices "on-the-fly" given an estimation of dynamic channel conditions or diverse channel structures. The channel may be decomposed into polarized sub-channels corresponding to the polarization codes, and mutual information profiles may be determined for each of the polarized sub-channels. The parity check matrix corresponding to the polarization codes may be constructed based on the mutual information profile of all polarized sub-channels. The wireless device may encode or decode data based on the constructed parity check matrix.

A method for wireless communications at a wireless device is described. The method may include identifying a channel structure for a wireless channel, generating a set of mutual information profile parameters corresponding to a set of polarized subchannels of the wireless channel based at least in part on the identified channel structure, selecting a plurality of polar transform sequences based at least in part on the set of mutual information profile parameters, and encoding or decoding a block of information based at least in part on the selected plurality of polar transform sequences.

An apparatus for wireless communications at a wireless device is described. The apparatus may include means for identifying a channel structure for a wireless channel, means for generating a set of mutual information profile parameters corresponding to a set of polarized subchannels of the wireless channel based at least in part on the identified channel structure, means for selecting a plurality of polar transform sequences based at least in part on the set of mutual information profile parameters, and means for encoding or decoding a block of information based at least in part on the selected plurality of polar transform sequences.

A further apparatus for wireless communications at a wireless device is described. The apparatus may include a processor and memory coupled with the processor, wherein the processor is configured to identify a channel structure for a wireless channel, generate a set of mutual information profile parameters corresponding to a set of polarized subchannels of the wireless channel based at least in part on the identified channel structure, select a plurality of polar transform sequences based at least in part on the set of mutual information profile parameters, and encode or decode a block of information based at least in part on the selected plurality of polar transform sequences.

A non-transitory computer-readable medium storing instructions for wireless communications at a wireless device is described. The instructions may include instructions executable by a processor to identify a channel structure for a wireless channel, generate a set of mutual information profile parameters corresponding to a set of polarized subchannels of the wireless channel based at least in part on the identified channel structure, select a plurality of polar transform sequences based at least in part on the set of mutual information profile parameters, and encode or decode a block of information based at least in part on the selected plurality of polar transform sequences.

In some examples of the method, apparatuses, or non-transitory computer-readable medium described above, a number of the plurality of polar transform sequences is based at least in part on a code rate, and encoding or decoding the block of information comprises encoding or decoding the block of information with the code rate. Additionally or alternatively, in some examples selecting the plurality of polar transform sequences comprises selecting a plurality of rows of a polar transform matrix.

Some examples of the method, apparatuses, or non-transitory computer-readable medium described above may further include processes, features, means, or instructions for selecting a mutual information bin pattern, and generating the set of mutual information profile parameters comprises determining the mutual information profile parameters based at least in part on the mutual information bin pattern. Additionally or alternatively, some examples may include processes, features, means, or instructions for calculating an upper bound or a lower bound for a channel quality parameter (e.g., the mean, or variance of the mutual information profile) by adjusting the mutual information bin pattern.

In some examples of the method, apparatuses, or non-transitory computer-readable medium described above, the mutual information bin pattern is non-uniform. Additionally or alternatively, in some examples the mutual information bin pattern is based at least in part on a non-linear function (e.g., a non-linear binary entropy function).

Some examples of the method, apparatuses, or non-transitory computer-readable medium described above may further include processes, features, means, or instructions for selecting a second mutual information bin pattern including fewer bins than the mutual information bin pattern based at least in part on a computational speed. Additionally or alternatively, some examples may include processes, features, means, or instructions for transmitting the encoded block of information over the wireless channel.

Some examples of the method, apparatuses, or non-transitory computer-readable medium described above may further include processes, features, means, or instructions for transmitting a message comprising an indication of the plurality of polar transform sequences. Additionally or alternatively, in some examples a number of the set of polarized subchannels is the same as a number of bits in a transport block.

In some examples of the method, apparatuses, or non-transitory computer-readable medium described above, the channel structure for the wireless channel comprises a binary input symmetric memoryless (BISM) channel, a binary symmetric channel (BSC), a binary additive white Gaussian noise (B-AWGN) channel, or a binary erasure channel (BEC). Additionally or alternatively, in some examples the channel structure comprises a q-ary input channel or a multiple input multiple output (MIMO) channel.

Some examples of the method, apparatuses, or non-transitory computer-readable medium described above may further include processes, features, means, or instructions for calculating at least one mean parameter, variance parameter, or higher order error analysis parameter for a polarized subchannel of the set of polarized subchannels based at least in part on the set of mutual information profile parameters.

A method for wireless communications at a wireless device is described. The method may include selecting a first plurality of polar transform sequences based at least in part on a first channel structure for a wireless channel, encoding or decoding a first block of information based at least in part on the first plurality of polar transform sequences, selecting a second plurality of polar transform sequences based at least in part on a second channel structure for the wireless channel, wherein the second channel structure is different from the first channel structure and the second plurality of polar transform sequences is different from the first plurality of polar transform sequences, and encoding or decoding a second block of information based at least in part on the second plurality of polar transform sequences. Thus, a flexible communication framework is possible in which different channel types and channel structures are supported using the same polar encoding and polar decoding architecture.

An apparatus for wireless communications at a wireless device is described. The apparatus may include means for selecting a first plurality of polar transform sequences based at least in part on a first channel structure for a wireless channel, means for encoding or decoding a first block of information based at least in part on the first plurality of polar transform sequences, means for selecting a second plurality of polar transform sequences based at least in part on a second channel structure for the wireless channel, wherein the second channel structure is different from the first channel structure and the second plurality of polar transform sequences is different from the first plurality of polar transform sequences, and means for encoding or decoding a second block of information based at least in part on the second plurality of polar transform sequences.

A further apparatus for wireless communications at a wireless device is described. The apparatus may include a processor and memory coupled with the processor, wherein the processor is configured to select a first plurality of polar transform sequences based at least in part on a first channel structure for a wireless channel, encode or decode a first block of information based at least in part on the first plurality of polar transform sequences, select a second plurality of polar transform sequences based at least in part on a second channel structure for the wireless channel, wherein the second channel structure is different from the first channel structure and the second plurality of polar transform sequences is different from the first plurality of polar transform sequences, and encode or decode a second block of information based at least in part on the second plurality of polar transform sequences.

A non-transitory computer-readable medium storing instructions for wireless communications at a wireless device is described. The instructions may include instructions executable by a processor to select a first plurality of polar transform sequences based at least in part on a first channel structure for a wireless channel, encode or decode a first block of information based at least in part on the first plurality of polar transform sequences, select a second plurality of polar transform sequences based at least in part on a second channel structure for the wireless channel, wherein the second channel structure is different from the first channel structure and the second plurality of polar transform sequences is different from the first plurality of polar transform sequences, and encode or decode a second block of information based at least in part on the second plurality of polar transform sequences.

In some examples of the method, apparatuses, or non-transitory computer-readable medium described above, selecting the first plurality of polar transform sequences comprises utilizing Monte Carlo sampling, density evolution, mutual information profiling, or sequence upgrading/downgrading. Additionally or alternatively, in some examples selecting the second plurality of polar transform sequences comprises utilizing a same method used for selecting the first plurality of polar transform sequences.

In some examples of the method, apparatuses, or non-transitory computer-readable medium described above, selecting the second plurality of polar transform sequences comprises utilizing a different method than for selecting the first plurality of polar transform sequences. Additionally or alternatively, in some examples selecting the second plurality of polar transform sequences comprises updating the first plurality of polar transform sequences based at least in part on identifying the second channel structure.

A method for wireless communications at a wireless device is described. The method may include receiving an indication of a plurality of polar transform sequences based at least in part on a set of mutual information profile parameters corresponding to a wireless channel, encoding or decoding a block of information based at least in part on the received indication of the plurality of polar transform sequences, and transmitting the block of information over the wireless channel based at least in part on the encoding.

An apparatus for wireless communications at a wireless device is described. The apparatus may include means for receiving an indication of a plurality of polar transform sequences based at least in part on a set of mutual information profile parameters corresponding to a wireless channel, means for encoding or decoding a block of information based at least in part on the received indication of the plurality of polar transform sequences, and means for transmitting the block of information over the wireless channel based at least in part on the encoding.

A further apparatus for wireless communications at a wireless device is described. The apparatus may include a processor and memory coupled with the processor, wherein the processor is configured to receive an indication of a plurality of polar transform sequences based at least in part on a set of mutual information profile parameters corresponding to a wireless channel, encode or decode a block of information based at least in part on the received indication of the plurality of polar transform sequences, and transmit the block of information over the wireless channel based at least in part on the encoding.

A non-transitory computer-readable medium storing instructions for wireless communications at a wireless device is described. The instructions may include instructions executable by a processor to receive an indication of a plurality of polar transform sequences based at least in part on a set of mutual information profile parameters corresponding to a wireless channel, encode or decode a block of information based at least in part on the received indication of the plurality of polar transform sequences, and transmit the block of information over the wireless channel based at least in part on the encoding.

Some examples of the method, apparatuses, or non-transitory computer-readable medium described above may further include processes, features, means, or instructions for selecting a plurality of rows of a polar transform matrix based at least in part on the indication (i.e., the indication received from another wireless device), wherein encoding the block of information is based at least in part on the selected plurality of rows.

The foregoing has outlined features and technical advantages of examples according to the disclosure to clarify the detailed description. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purpose of illustration and description only, and not as a definition of the limits of the claims.

BRIEF DESCRIPTION OF THE DRAWINGS

A further understanding of the nature and advantages of the present disclosure may be realized by reference to the following drawings. In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

DETAILED DESCRIPTION

Figure 1:
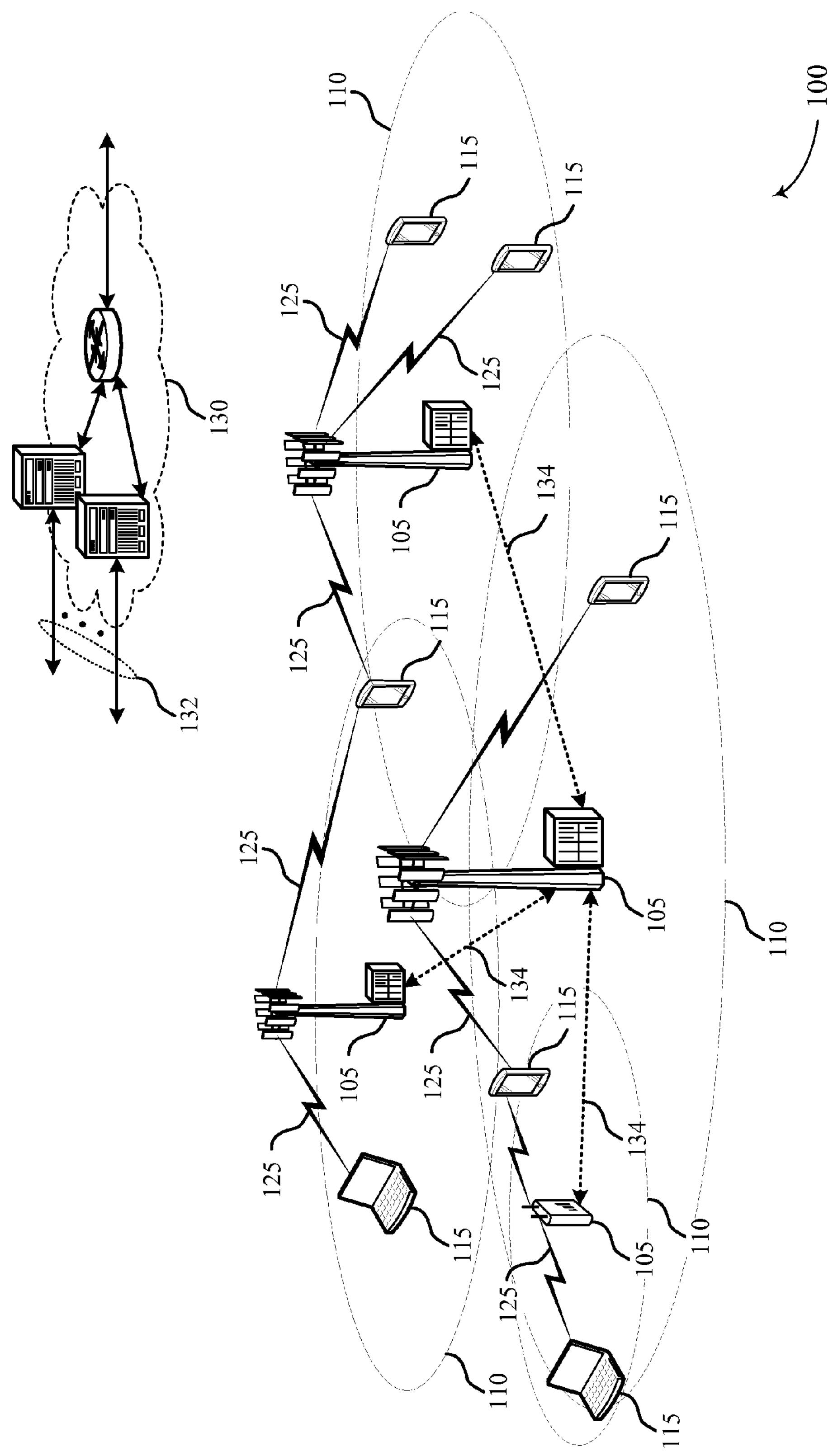
FIG. 1 illustrates an example of a wireless communications system for adaptive channel coding using polarization in accordance with various aspects of the present disclosure.

The described features generally relate to improved systems, methods, or apparatuses for adaptive channel coding using polarization. A wireless device may adaptively select a parity check matrix to increase the reliability of signal transmission over a noisy channel. For example, polar codes may be used to construct parity check matrices "on-the-fly" based on dynamic channel settings and signal-to-noise (SNR) levels. Polar codes are low-complexity, capacity-achieving codes for point-to-point discrete, memoryless channels. Adaptive polar codes may be generated based on mutual information profiles for polarized subchannels of the noisy channel.

Wireless transmissions may be sent over noisy channels. A noisy channel may be described by a conditional distribution $P_{Y|X}(y|x)$, where input random variable X takes values from an input alphabet, and output random variable Y takes values from an output alphabet. In one example, the input alphabet is a binary input alphabet and the output alphabet is an arbitrary output alphabet such as a range of real numbers. To increase reliability in a noisy environment, wireless devices may encode data with parity bits used to detect and correct errors at the receiving end. For example, a k×n generator matrix G may be used to specify how a k-length message, u, maps to a valid codeword, x, via the equation $x^T=u^TG$. However, the efficiency of different encoding algorithms may depend on channel statistics and the channel statistics may change over time. Thus, pilot signals may be used by both the encoder and decoder to estimate channel statistics and a flexible coding protocol may be used to adapt the encoding algorithm to the dynamic conditions.

An adaptive polar code may be calculated by selecting a subset of rows of a polar generator matrix. For instance, k indices of the generator matrix may be chosen from a set of $$\frac{k}{n}.$$

rows based on a code of rate Rows of the generator matrix may be chosen so that the resulting adaptive polar matrix is reliable over the target channel. If new channel parameters are detected, a different subset of rows may be selected from the generator matrix.

One example of a polar code generating matrix is the n×n polarization matrix $$G_n = \begin{bmatrix} 1 & 0 \\ 1 & 1 \end{bmatrix}^{\otimes log_2(n)}, \tag{1}$$

where ⊗ denotes the Kronecker matrix product and n is the number of polarized channels. The n polarized subchannels correspond to the rows of the matrix. Methods for selecting a parity check matrix based on the generator matrix may include density evolution, sampling methods, and channel upgrade/downgrade techniques. According to the present disclosure, a wireless device may also generate the parity check matrix by calculating mutual information profiles for the polarized subchannel. The device may then construct a parity check matrix by selecting rows of the generator matrix based on the mutual information profiles. The device may encode and transmit data (or receive and decode data) based on the constructed parity check matrix. In some cases, the mutual information profiles may be approximated based on a given bin size to reduce computational complexity and to provide lower and upper bounds on coding efficiency.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in other examples.

FIG. 1 illustrates an example of a wireless communications system 100 in accordance with various aspects of the present disclosure. The wireless communications system 100 includes base stations 105, at least one user equipment (UE) 115, and a core network 130. The core network 130 may provide user authentication, access authorization, tracking, internet protocol (IP) connectivity, and other access, routing, or mobility functions. The base stations 105 interface with the core network 130 through backhaul links 132 (e.g., S1, etc.). The base stations 105 may perform radio configuration and scheduling for communication with the UEs 115, or may operate under the control of a base station controller (not shown). In various examples, the base stations 105 may communicate, either directly or indirectly (e.g., through core network 130), with one another over backhaul links 134 (e.g., X1, etc.), which may be wired or wireless communication links.

The base stations 105 may wirelessly communicate with the UEs 115 via one or more base station antennas. Each of the base stations 105 may provide communication coverage for a respective geographic coverage area 110. In some examples, base stations 105 may be referred to as a base transceiver station, a radio base station, an access point, a radio transceiver, a NodeB, eNodeB (eNB), Home NodeB, a Home eNodeB, or some other suitable terminology. The geographic coverage area 110 for a base station 105 may be divided into sectors making up only a portion of the coverage area (not shown). The wireless communications system 100 may include base stations 105 of different types (e.g., macro or small cell base stations). There may be overlapping geographic coverage areas 110 for different technologies.

In some examples, the wireless communications system 100 is a Long Term Evolution (LTE)/LTE-Advanced (LTE-A) network. In LTE/LTE-A networks, the term evolved node B (eNB) may be generally used to describe the base stations 105, while the term UE may be generally used to describe the UEs 115. The wireless communications system 100 may be a heterogeneous LTE/LTE-A network in which different types of eNBs provide coverage for various geographical regions. For example, each eNB or base station 105 may provide communication coverage for a macro cell, a small cell, or other types of cell. The term "cell" is a 3GPP term that can be used to describe a base station, a carrier or component carrier associated with a base station, or a coverage area (e.g., sector, etc.) of a carrier or base station, depending on context.

A macro cell generally covers a relatively large geographic area (e.g., several kilometers in radius) and may allow unrestricted access by UEs 115 with service subscriptions with the network provider. A small cell is a lower-powered base station, as compared with a macro cell, that may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs 115 with service subscriptions with the network provider. A femto cell may also cover a small geographic area (e.g., a home) and may provide restricted access by UEs 115 having an association with the femto cell (e.g., UEs 115 in a closed subscriber group (CSG), UEs 115 for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells (e.g., component carriers).

The wireless communications system 100 may support synchronous or asynchronous operation. For synchronous operation, the base stations 105 may have similar frame timing, and transmissions from different base stations 105 may be approximately aligned in time. For asynchronous operation, the base stations 105 may have different frame timing, and transmissions from different base stations 105 may not be aligned in time. The techniques described herein may be used for either synchronous or asynchronous operations.

The communication networks that may accommodate some of the various disclosed examples may be packet-based networks that operate according to a layered protocol stack and data in the user plane may be based on the IP. A radio link control (RLC) layer may perform packet segmentation and reassembly to communicate over logical channels. A medium access control (MAC) layer may perform priority handling and multiplexing of logical channels into transport channels. The MAC layer may also use hybrid automatic repeat request (HARM) to provide retransmission at the MAC layer to improve link efficiency. In the control plane, the radio resource control (RRC) protocol layer may provide establishment, configuration, and maintenance of an RRC connection between a UE 115 and the base stations 105. The RRC protocol layer may also be used for core network 130 support of radio bearers for the user plane data. At the physical (PHY) layer, the transport channels may be mapped to physical channels.

The UEs 115 may be dispersed throughout the wireless communications system 100, and each UE 115 may be stationary or mobile. A UE 115 may also include or be referred to by those skilled in the art as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may be a cellular phone, a smartphone, a personal digital assistant (PDA), a wireless modem, a wireless communication device, a handheld device, a tablet computer, a laptop computer, a cordless phone, a wireless local loop (WLL) station, or the like. A UE may be able to communicate with various types of base stations and network equipment including macro eNBs, small cell eNBs, relay base stations, and the like.

The communication links 125 shown in wireless communications system 100 may include uplink (UL) transmissions from a UE 115 to a base station 105, or downlink (DL) transmissions, from a base station 105 to a UE 115. The downlink transmissions may also be called forward link transmissions while the uplink transmissions may also be called reverse link transmissions. Each communication link 125 may include one or more carriers, where each carrier may be a signal made up of multiple sub-carriers (e.g., waveform signals of different frequencies) modulated according to the various radio technologies described above. Each modulated signal may be sent on a different sub-carrier and may carry control information (e.g., reference signals, control channels, etc.), overhead information, user data, etc. The communication links 125 may transmit bidirectional communications using frequency division duplex (FDD) (e.g., using paired spectrum resources) or time division duplex (TDD) operation (e.g., using unpaired spectrum resources). Frame structures may be defined for FDD (e.g., frame structure type 1) and TDD (e.g., frame structure type 2).

In some examples of the wireless communications system 100, base stations 105 or UEs 115 may include multiple antennas for employing antenna diversity schemes to improve communication quality and reliability between base stations 105 and UEs 115. Additionally or alternatively, base stations 105 or UEs 115 may employ multiple input multiple output (MIMO) techniques that may take advantage of multi-path environments to transmit multiple spatial layers carrying the same or different coded data.

A UE 115 may be configured to collaboratively communicate with multiple base stations 105 through, for example, MIMO, Coordinated Multi-Point (CoMP), or other schemes. MIMO techniques use multiple antennas on the base stations or multiple antennas on the UE to take advantage of multipath environments to transmit multiple data streams. CoMP includes techniques for dynamic coordination of transmission and reception by a number of eNBs to improve overall transmission quality for UEs as well as increasing network and spectrum utilization.

Multipath propagation may be caused by different copies of a wireless signal reaching a receiver via different paths with varying path lengths. The different path lengths may be based on, for example, atmospheric reflection and refraction, or reflection from buildings, water, and other surfaces. Multipath propagation may result in a time delay (or a phase shift) for one copy of a signal, which cause constructive or destructive interference (between consecutive symbols, inter-symbol interference (ISI), or within a single symbol). A guard interval (GI) (which may include a cyclic prefix) may be prepended to transmissions to mitigate the effects of channel spreading caused by multipath propagation.

A base station 105 may insert periodic pilot symbols such as cell-specific reference signals (CRS) to aid UEs 115 in channel estimation and coherent demodulation. CRS may include one of 504 different cell identities. The pilot signals may be modulated using quadrature phase shift keying (QPSK) and power boosted (e.g., transmitted at 6 dB higher than the surrounding data elements) to make them resilient to noise and interference. CRS may be embedded in 4 to 16 resource elements of each resource block based on the number of antenna ports or layers (up to 4) of the receiving UEs 115. In addition to CRS, which may be utilized by all UEs 115 in the geographic coverage area 110 of the base station 105, demodulation reference signal (DMRS) may be directed toward specific UEs 115 and may be transmitted on resource blocks assigned to those UEs 115. DMRS may include signals on 6 resource elements in each resource block in which they are transmitted. In some cases, two sets of DMRS may be transmitted in adjoining resource elements. In some cases, additional reference signals known as channel state information reference signals (CSI-RS) may be included to aid in generating channel state information (CSI). On the UL, a UE 115 may transmit a combination of periodic SRS and UL DMRS for link adaptation and demodulation, respectively.

A sounding reference signal (SRS) may be transmitted by a UE 115 using a predetermined sequence (e.g., a Zadoff-Chu sequence) so that a base station 105 may estimate the UL channel quality. An SRS transmission may not be associated with transmission of data on another channel, and may be transmitted periodically on a wide bandwidth (e.g., a bandwidth including more subcarriers than are allocated for UL data transmission). An SRS may also be scheduled on multiple antenna ports and may still be considered a single SRS transmission. An SRS transmission may be categorized as a Type 0 (periodically transmitted at equally spaced intervals) SRS or as a Type 1 (aperiodic) SRS. Thus, data gathered by a base station 105 from an SRS may be used to inform an UL scheduler. A base station 105 may also utilize an SRS to check timing alignment status and send time alignment commands to the UE 115.

In some cases, wireless communications system 100 may support operation on multiple cells or carriers, a feature which may be referred to as carrier aggregation (CA) or multi-carrier operation. A carrier may also be referred to as a component carrier (CC), a layer, a channel, etc. The terms "carrier," "component carrier," "cell," and "channel" may be used interchangeably herein. A UE 115 may be configured with multiple downlink CCs and one or more uplink CCs for carrier aggregation. Carrier aggregation may be used with both FDD and TDD component carriers.

According to the present disclosure, base stations 105 may adaptively select a parity check matrix to increase the reliability of signal transmission to UE 115. For instance, polarization codes (i.e., rows of a polarization matrix) may be used to construct parity check matrices "on-the-fly" given an estimation of dynamic channel conditions. A communication link 125 may occur over a physical channel. The channel may be decomposed into polarized subchannels corresponding to the polarization codes, and mutual information profiles may be determined for each of the polarized subchannels. The parity check matrix may be constructed from the polarization codes corresponding to the subchannels based on the mutual information profiles. The parity check matrix corresponding to the polarization codes may be constructed based on the mutual information profiles of all the polarized subchannels. The base station 105 may encode data and the UE 115 may decode data based on the constructed parity check matrix. In other examples, UE 115 may construct the parity check matrix and encode data, while the base station 105 may decode the data.

Figure 2:
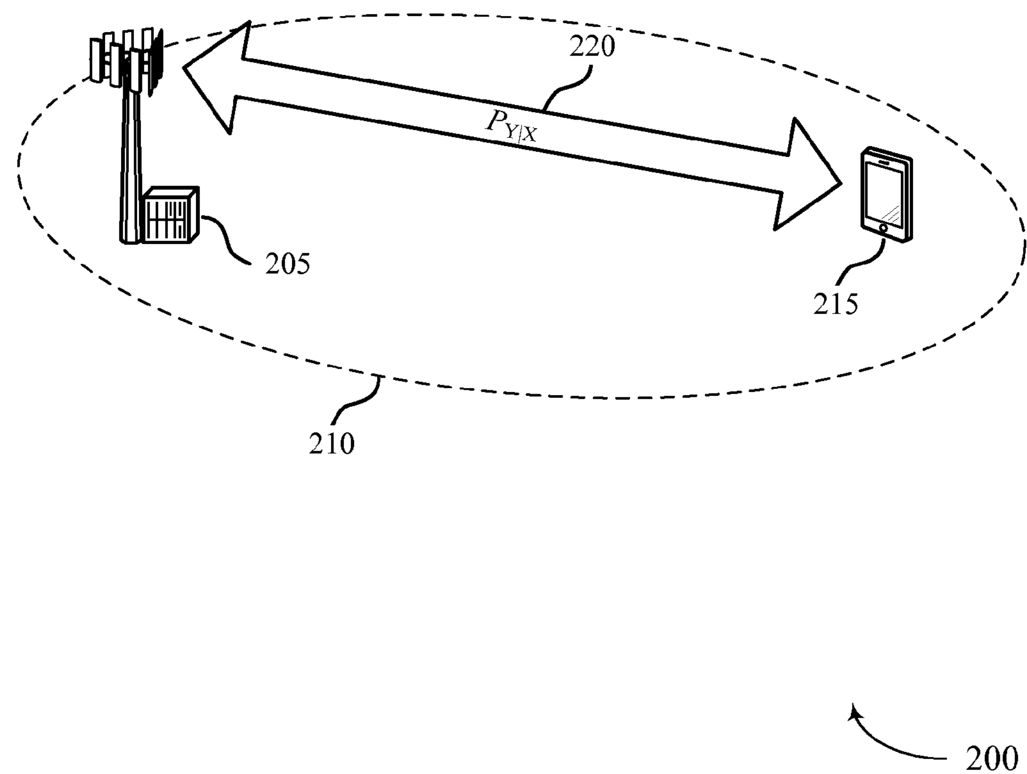
FIG. 2 illustrates an example of a wireless communications subsystem for adaptive channel coding using polarization in accordance with various aspects of the present disclosure.

FIG. 2 illustrates an example of a wireless communications system 200 for channel coding using polarization in accordance with various aspects of the present disclosure. Wireless communications system 200 may include UE 215, base station 205, and coverage area 210, which may be examples of a UE 115, a base station 105, and a coverage area 110, respectively, described above with reference to FIG. 1. Base station 205 and UE 215 may communicate with one another via a downlink or an uplink when UE 215 is within coverage area 210, as generally described above with reference to FIG. 1. This communication may occur over a physical channel 220.

In some cases, a wireless device may encode data using a parity check matrix before transmitting a signal over physical channel 220. However, using a fixed parity check matrix may not be efficient in dynamically changing physical channel conditions. Therefore, according to the present disclosure, a wireless device may adaptively select a parity check matrix to enable more reliable signal transmission. The adaptive parity check matrix may be constructed by selecting rows from a polarization matrix. For example, the polarization matrix may be used to decompose physical channel 220 into polarized subchannels and the wireless device may determine which rows to select based on the mutual information profiles of the polarized subchannels.

Thus, base station 205 may transmit a signal to UE 215 over dynamically changing physical channel 220. The characteristics of physical channel 220 may be represented by a conditional distribution $P_{Y|X}(y|x)$, which may be derived using pilot signals sent between UE 215 and base station 205. Before transmission, data may be encoded to increase the reliability of a communication link. In some examples, polarization codes may be used to construct parity check matrices "on-the-fly" given a pilot estimation of the channel statistics, and therefore, may construct parity check matrices that are adaptable to different channel settings and SNR levels.

In some cases, base station 205 may utilize a polarization matrix to deconstruct physical channel 220 into n polarized subchannels. Base station 205 may then determine mutual information profiles for polarized subchannels corresponding to rows of the polarization matrix. Base station 205 may construct a parity check matrix based on the mutual information profiles of the polarized subchannels by selecting a subset of the rows. In some examples, base station 205 and UE 215 may exchange the constructed parity check matrix information to ensure they are using the same parity check matrix for encoding and decoding data. Base station 205 may then encode and transmit a block of data based on the constructed parity check matrix, and UE 215 may receive and decode the data. In some cases, UE 215 may be the encoder (transmitter) and base station 205 may be the decoder (receiver).

Figure 3A:
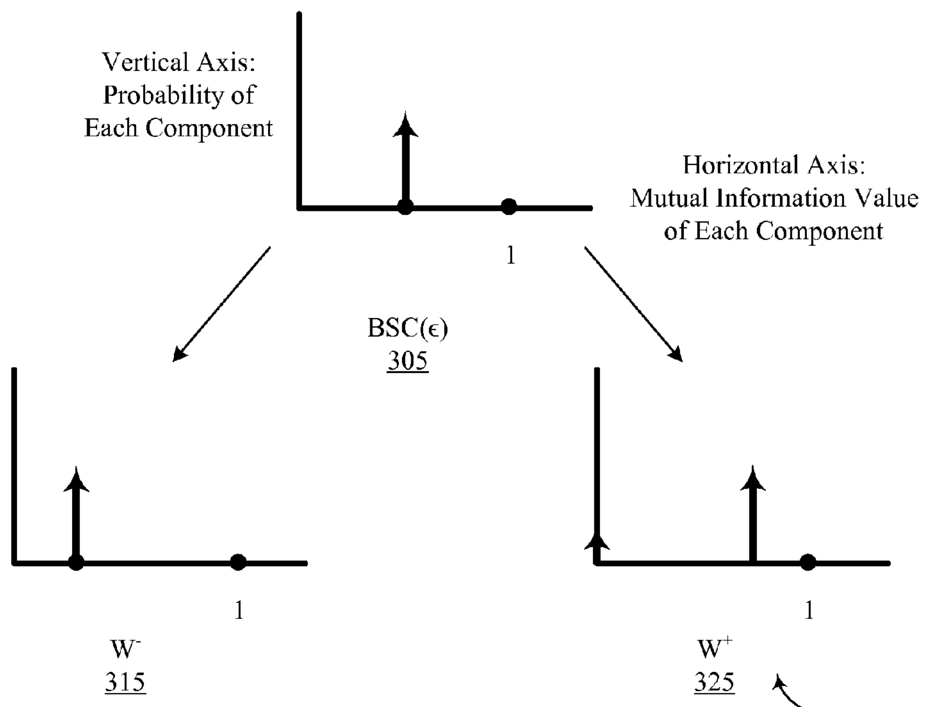
FIGS. 3A and 3B illustrate example channel decompositions binary input channels for adaptive channel coding using polarization in accordance with various aspects of the present disclosure.

FIG. 3A illustrates an example channel decomposition 301 of a binary symmetric channel (BSC) 305 for adaptive channel coding using polarization in accordance with various aspects of the present disclosure. Channel decomposition 301 may be based on a physical channel 220 used for transmission between a UE 115, 215 and a base station 105, 205 as described above with reference to FIGS. 1-2. Channel decomposition 301 illustrates the mutual information profile of BSC 305, polarized sub-channel $W^-$ 315 and polarized sub-channel and $W^+$ 325. For a binary-input channel such as a BSC, the horizontal axis of the corresponding profile may be any real number from 0 to 1, and may represent the mutual information value of the channel's components. The vertical axis of a channel's profile represents the probability of obtaining a particular mutual information value (i.e., the probability of obtaining a particular component of the channel).

The channel decomposition 301 illustrates the result of polar coding to decompose a physical channel into polarized sub-channels. For example, a BSC($\epsilon$) channel 305 may be decomposed into polarized sub-channel $W^-$ 315 and polarized sub-channel and $W^+$ 325 after a one-step polarization. After polarization of the BSC($\epsilon$) channel 305, the mutual information profile of polarized sub-channel $W^+$ 325 may be preferable to that of polarized sub-channel $W^-$ 315. That is, the mutual information values of the components of polarized sub-channel $W^+$ 325 are closer on average to the highest possible mutual information value of 1. Therefore, polarized sub-channel $W^+$ 325 may be a better candidate for the transmission of a signal, because it has a lower probability of error.

It may be shown that the mutual information of BSC($\epsilon$) channel 305 is preserved after polarization. The channel transition matrix for a BSC($\epsilon$) with parameter $\epsilon$ may be given as:

$$T_{BSC(\epsilon)} = \begin{bmatrix} 1-\epsilon & \epsilon \\ \epsilon & 1-\epsilon \end{bmatrix}. \tag{2}$$

Given two BSC channels, BSC($\epsilon_1$) and BSC($\epsilon_2$), with binary input and output random variables ($X_1$, $Y_1$) and ($X_2$, $Y_2$), and conditional distributions $P_{Y|X}(y_1|x_1)$ and $P_{Y|X}(y_2|x_2)$, respectively, wherein:

$$P_{Y|X}(y_1|x_1)=(1-\epsilon_1)\mathbb{1}_{[x_1=y_1]}+(\epsilon_1)\mathbb{1}_{[x_1\neq y_1]}; \tag{3}$$

$$P_{Y|X}(y_2|x_2)=(1-\epsilon_2)\mathbb{1}_{[x_2=y_2]}+(\epsilon_2)\mathbb{1}_{[x_2\neq y_2]}; \tag{4}$$

the polarized sub-channels may be characterized by:

$$U_1 \triangleq X_1 \oplus X_2; \quad (5)$$

$$U_2 \triangleq X_2; \quad (6)$$

and the corresponding conditional distributions:

$$W^- \triangleq P_{Y_1Y_2|U_1}(y_1,y_2|u_1) \quad (7)$$

$$W^+ \triangleq P_{Y_2Y_2U_1|U_2}(y_1,y_2,u_1|u_2) \quad (8)$$

The channel transition matrices for the polarized sub-channels may then be derived. For uniform independent random variables $U_1$, $U_2$ channel $W^-$ has mutual information $I(U_1; Y_1Y_2)$ while channel $W^+$ has mutual information $I(U_2; Y_1Y_2U_1)$. Transition matrices for $W^-$ and $W^+$ may be:

$$T_{W^-} = \begin{bmatrix} 1-\alpha & \alpha & 1-\alpha & \alpha \\ \alpha & 1-\alpha & \alpha & 1-\alpha \end{bmatrix}; \quad (9)$$

$$T_{W^+} = \begin{bmatrix} \beta_1 & \beta_2 & \gamma_1 & \gamma_2 & \beta_1 & \beta_2 & \gamma_1 & \gamma_2 \\ \beta_2 & \beta_1 & \gamma_2 & \gamma_1 & \beta_2 & \beta_1 & \gamma_2 & \gamma_1 \end{bmatrix}; \quad (10)$$

where the entries are given by:

$$\alpha = \epsilon_1 + \epsilon_2 - 2\epsilon_1\epsilon_2 \quad (11)$$

$$\beta_1 = 1 - \epsilon_1 - \epsilon_2 + \epsilon_1\epsilon_2 \quad (12)$$

$$\beta_2 = \epsilon_1\epsilon_2 \quad (13)$$

$$\gamma_1 = \epsilon_1 - \epsilon_1\epsilon_2 \quad (14)$$

$$\gamma_2 = \epsilon_2 - \epsilon_1\epsilon_2 \quad (15)$$

such that $\beta_1+\beta_2+\gamma_1+y_2=1$, and that the transition matrices exhibit symmetry. The state transition matrices may be derived after deriving the conditional distribution of channels $W^-$ and $W^+$.

Mutual information for the polarized sub-channels may also be derived. The mutual information for the weaker polarized sub-channel $W^-$ may be denoted by $I(W^-)$ and the mutual information for the stronger channel $W^+$ may be denoted by $I(W^+)$. Since the polarized sub-channels decompose into BSCs, the exact mutual information values are computable. This characteristic of decomposition also holds for binary input symmetric memoryless channels (BISMCs). The mutual information profile method may be used to decompose the polarized sub-channels and is derived from the channel transition matrices characterized above. The mutual information for both channels may be given as:

$$I(W^-) = 1 - h_b(\epsilon_1 + \epsilon_2 - 2\epsilon_1\epsilon_2) \quad (16)$$

$$I(W^+) = (1 - \epsilon_1 - \epsilon_2 + 2\epsilon_1\epsilon_2)\left(1 - h_b\left(\frac{\epsilon_1\epsilon_2}{1 - \epsilon_1 - \epsilon_2 + 2\epsilon_1\epsilon_2}\right)\right) + (\epsilon_1 + \epsilon_2 - 2\epsilon_1\epsilon_2)\left(1 - h_b\left(\frac{\epsilon_1 - \epsilon_1\epsilon_2}{\epsilon_1 + \epsilon_2 - 2\epsilon_1\epsilon_2}\right)\right) \quad (17)$$

such that $$I(W^-)+I(W^+)=2-h_b(\epsilon_1)-h_b(\epsilon_2) \quad (18)$$

and total mutual information after polarization is preserved.

If two identical channels BSC($\epsilon$) and BSC($\epsilon$) are considered, the conservation of mutual information may also be shown. The mutual information for the channels is given as:

$$I(W^-) = 1 - h_b(2\epsilon + 2\epsilon^2) \quad (19)$$

$$I(W^+) = (1 - 2\epsilon + 2\epsilon^2)\left(1 - h_b\left(\frac{\epsilon^2}{1 - 2\epsilon + 2\epsilon^2}\right)\right) + (2\epsilon - 2\epsilon^2)\left(1 - h_b\left(\frac{\epsilon - \epsilon^2}{2\epsilon - 2\epsilon^2}\right)\right) \quad (20)$$

Solving the equation $I(W^-)+I(W^+)$ will yield $2(1-h_b(\epsilon))$, demonstrating that the mutual information is preserved. If one BSC is an opaque channel, or BSC($\epsilon$) and BSC(½), the mutual information may be $$I(W^-)=0 \text{ and } I(W^+)=1-h_b(\epsilon). \quad (21)$$

Alternatively, if one BSC is a noiseless channel, the mutual information may be $$I(W^-)=1-h_b(\epsilon) \text{ and } I(W^+)=1. \quad (22)$$

After applying a polar transform to a wireless channel, the wireless channel is decomposed into polarized sub-channels. Each polarized sub-channel may be characterized by its mutual information profile. As an example, consider a binary input symmetric channel (BISM) with input and output random variables (X, Y). The mutual information profile of the BISM is given by $N_S$ components, where each component is characterized by a component variable S and corresponding mutual information: $I(X; Y|S=s)$. Assume a uniform input distribution on input X. Then define the function mapping $$f_J(s) \triangleq I(X;Y|S=s); \quad (23)$$

The random variable $J \triangleq f_J(S)$ is defined as the mutual information indicator of the BISM. The probability density of J is denoted as $P_J(j)$ and is the mutual information profile of the BISM. For channels with a finite discrete output alphabet, $$P_J(j) \triangleq \sum_{s=1}^{N_S} \omega_s \delta(j - f_J(s)), \text{ where} \quad (24)$$

$\delta(\bullet)$ is the Dirac delta function.

Thus the profile of a BISM with finite output alphabet may be represented by a set of weight and mutual information pairs $\{(\omega_S, f_J(s))\}_{S=1}^{N_S}$, or for ease of notation $\{(\omega_S I_S)\}_{S=1}^{N_S}$. The mutual information profile of BSC($\epsilon$) channel 305 is shown along with the profiles of the resulting polarized sub-channels 315 and 325 after one-step of polarization, in FIG. 3A. The vertical axis of the mutual information profiles represents the weight/probability of the channel components, and the horizontal axis of the profile represents the mutual information value of the channel components (more precisely, the mutual information indicator: J=j). However, the polarization of a channel into polarized sub-channels is not limited to one step as depicted in FIG. 3A. Rather, an original channel can be polarized l times successively and recursively, resulting in $2^l$ polarized sub-channels for any natural number l. (e.g., $W^{++}$, $W^{+-}$, $W^{-+}$, $W^{--}$, $W^{+++}$, etc.).

Figure 3B:
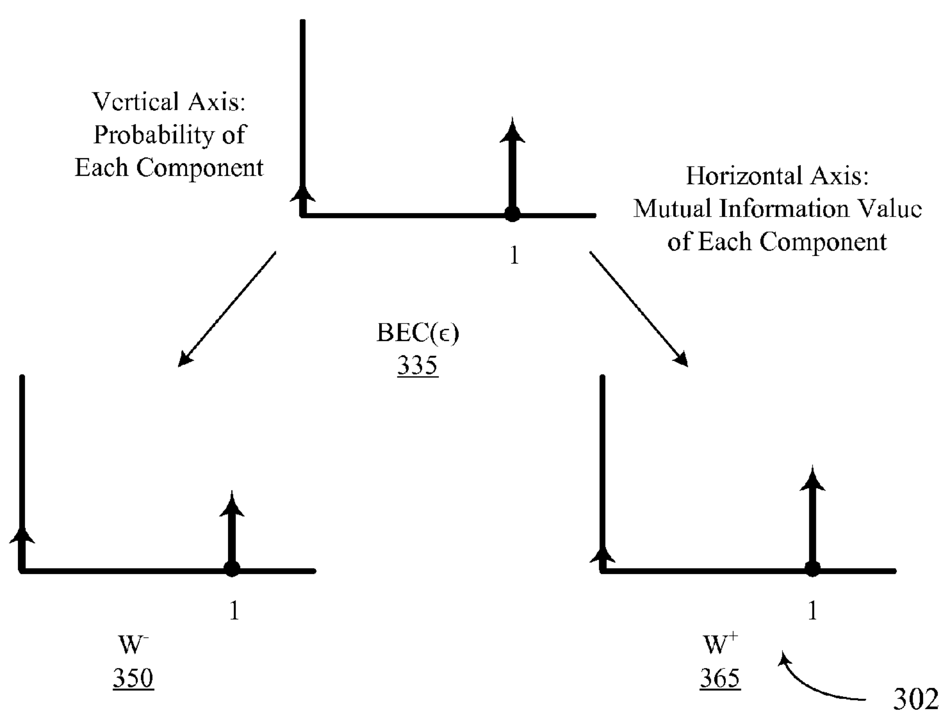

FIG. 3B illustrates an example of a channel decomposition 302 of a binary erasure channel (BEC) 335 for adaptive channel coding using polarization in accordance with various aspects of the present disclosure. Channel decomposition 302 may illustrate aspects of using polar coding to deconstruct a physical channel 220 used for transmission between a UE 115, 215 and a base station 105, 205 as described above with reference to FIGS. 1-2. Channel decomposition 302 may include the mutual information profile of BEC 335, polarized sub-channel $W^-$ 350 and polarized sub-channel $W^+$ 365. The mutual information profiles of channels 335, 350, and 365 capture the structure of the channels. For a binary-input channel, the horizontal axis of its profile may be any real number from 0 to 1, and represents the mutual information value of the channel's components (more precisely, the mutual information indicator: J=j). The vertical axis of a channel's profile represents the probability of obtaining a particular mutual information value (i.e., the probability of obtaining a particular component of the channel).

The channel decomposition 302 may correspond to the use of polar coding to decompose a physical channel into polarized sub-channels as described above with reference to FIG. 3A. For example, BEC($\epsilon$) channel 335 may be polarized into polarized sub-channel $W^-$ 350 and polarized sub-channel $W^+$ 365 in the event of a one-step polarization. After polarization of the BEC($\epsilon$) channel 335, polarized sub-channel $W^+$ 365 may be a better candidate for the transmission of a signal.

Figure 4:
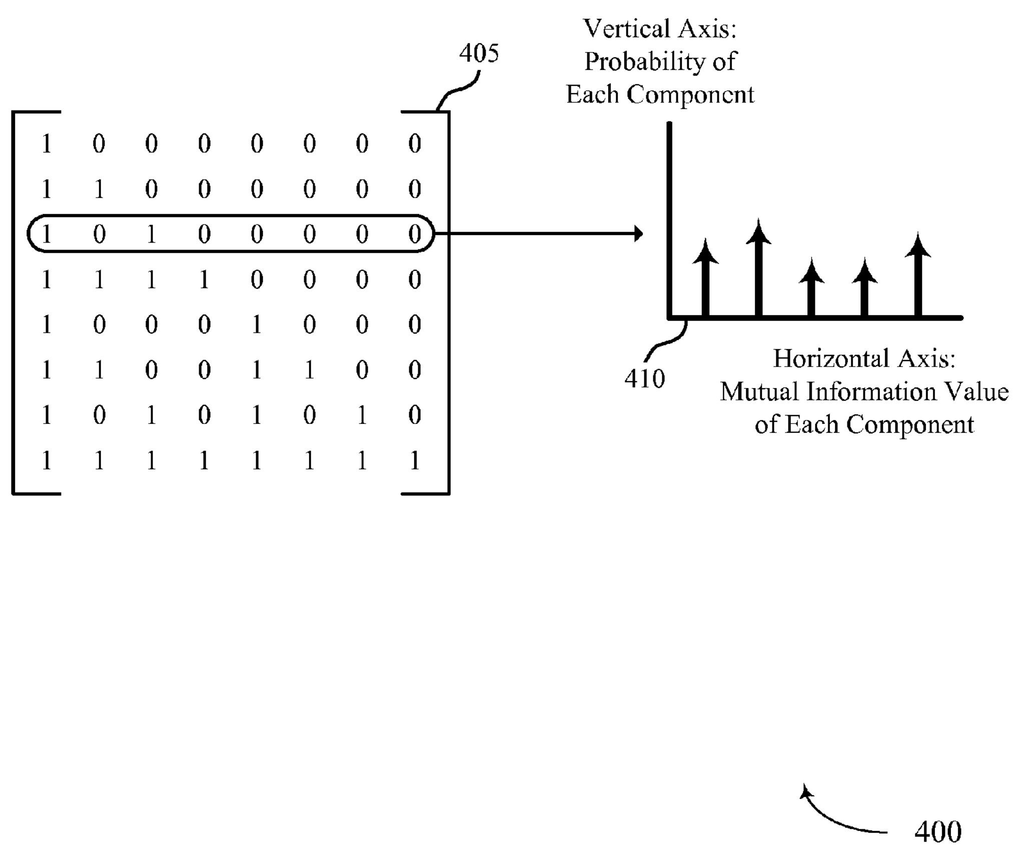
FIG. 4 illustrates an example of a channel polarization structure for adaptive channel coding using polarization in accordance with various aspects of the present disclosure.

FIG. 4 illustrates an example of a channel polarization structure 400 for adaptive channel coding using polarization in accordance with various aspects of the present disclosure. Channel polarization structure 400 may illustrate aspects of using polar coding to deconstruct a physical channel 220 used for transmission between a UE 115, 215 and a base station 105, 205 as described above with reference to FIGS. 1-2. Channel polarization structure 400 may also illustrate aspects of obtaining mutual information profiles for polarized subchannels. An n×n polarization matrix may be used to deconstruct a physical channel into n polarized sub-channels. A mutual information profile may then be determined for each polarized sub-channel, in which each polarized sub-channel corresponds to a nth row of the polarized matrix.

For example, the 8×8 polarization matrix 405 may be used to deconstruct a physical channel into 8 polarized sub-channels. Mutual information profiles may then be determined for each of the 8 polarized sub-channels. For example, the mutual information profile 410 corresponds to the 3rd row of the polarization matrix 405. In some cases, a single parameter such as the mean or a Riemann sum of the mutual information profile 410 may be computed to determine the mutual information value of a channel. The mutual information values may be used to pick k of n rows of the polarization matrix 405 (i.e., k sub-channels) to achieve a coding rate of $$\frac{k}{n}.$$

Although n=8 in FIG. 4, in some examples a polarization matrix may include 512, 1024, 2048, etc., columns or rows, and mutual information profiles may be computed for 512, 1024, 2048, etc. polarized sub-channels. In some examples, the inputs used in constructing the polarization matrix and computing the mutual information profile may be the polar code length $n=2^l$, the bin resolution, the code rate, and the channel characteristics, such as channel profile and probability tables. The inputs may be adaptively changed and applied to a mutual information profile computation algorithm. The algorithm may then yield the upper and lower bounds for the mutual information profile for all $2^l$ polar subchannels, which may be used to determine the best k of the n polar subchannels.

Figure 5:
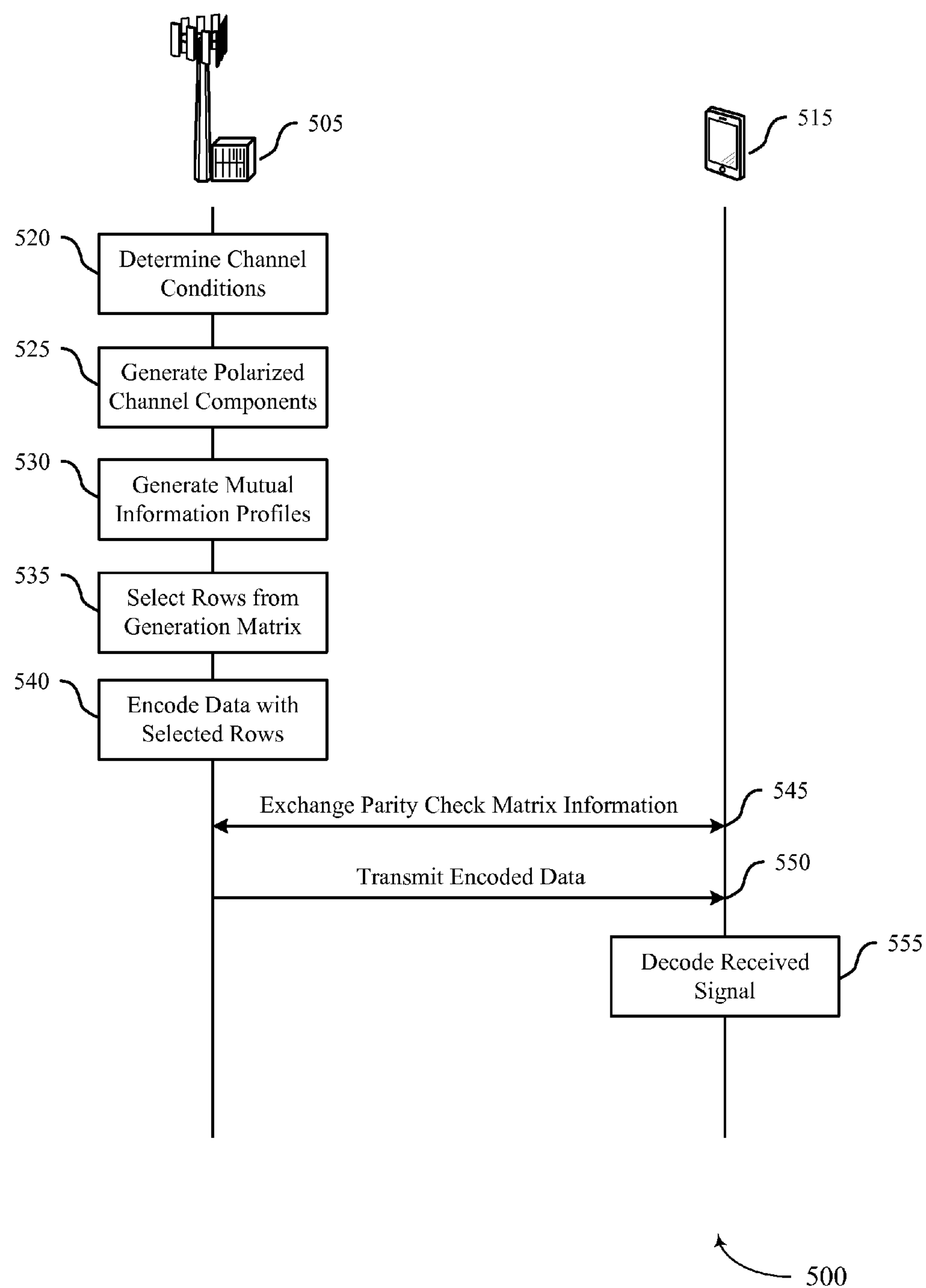
FIG. 5 illustrates an example of a process flow for adaptive channel coding using polarization in accordance with various aspects of the present disclosure.

FIG. 5 illustrates an example of a process flow 500 for adaptive channel coding using polarization in accordance with various aspects of the present disclosure. Process flow 500 may include UE 515 and base station 505, which may be examples of a UE 115, 215 and a base station 105, 205 respectively, described above with reference to FIGS. 1-2. In some cases, a base station 505 may generate mutual information profiles from the polarized components of a physical channel. The mutual information profiles may be used to construct a parity check matrix from rows selected from a generation matrix. The parity check matrix may be used to encode the data and parity check matrix info may be exchanged with UE 515 so that UE 515 may decode the received encoded data.

At block 520, the physical channel conditions may be determined by base station 505 or UE 515 or both. For example, base station 505 may determine the physical channel conditions by transmitting and receiving pilots. The pilots may be used to determine frequency, phase, and magnitude characteristics for the channel as well as the statistical properties of the channel. The characteristics of physical channel may be represented by a conditional distribution $P_{Y|X}$ and the channel conditions may change dynamically. In alternative examples, UE 515 may identify a channel structure for a wireless channel to determine the channel conditions and send base station 505 the channel condition information. In further examples, base station 505 may send the determined channel conditions to UE 515. In some examples, the channel structure for the wireless channel may include a binary input symmetric memoryless (BISM) channel, a binary symmetric channel (BSC), a binary additive white Gaussian noise (B-AWGN) channel, or a binary erasure channel (BEC). In some examples, the channel structure may include a q-ary input channel or a MIMO channel.

At block 525, the polarized sub-channel components may be generated based on the determined channel conditions. Polarization coding may decompose the determined channel into multiple polarized sub-channels. One-step polarization coding may decompose the determined channel into two polarized sub-channels $W^-$ and $W^+$, the transition matrices and mutual information of which has been derived above. Successive polarization coding may decompose the determined channel into additional polarized sub-channels. Additionally or alternatively, UE 515 may generate the polarized sub-channel components based on channel conditions determined by either base station 505 or UE 515.

At block 530, mutual information profiles may be generated based on the generated polarized channel components. Base station 505 may generate mutual information profiles for each polarized sub-channel as shown above with respect to FIGS. 3A, 3B, and 4. As an example, successive polarizations may be implemented for a BISM channel with a finite output alphabet. Two BISM channels may be characterized by their mutual information profiles $\{(\omega_{1k}, I_{1k})\}_{k=1}^{M}$ and $\{(\omega_{2l}, I_{2l})\}_{l=1}^{L}$. This may also be re-written in an equivalent mathematical form as $\{(\omega_{1k}, h_b^{-1})(1-I_{1k}))\}_{k=1}^{M}$ and $\{(\omega_{2l}, h_b^{-1}(1-I_{21}))\}_{l=1}^{L}$ using the standard inverse binary entropy function. The mutual information of the polarized sub-channels $W^-$ and $W^+$ may then be described as:

$$W^- = \{(\omega_{1k}\omega_{2l}, 1 - h_b(\epsilon_{1k} + \epsilon_{2l} - 2\epsilon_{1k}\epsilon_{2l}))\}_{k=1 \ldots M, l=1 \ldots L} \tag{25}$$

$$W^+ = \left\{\left(\begin{matrix} \omega_{1k}\omega_{2l}(1 - \epsilon_{1k} - \epsilon_{2l} + 2\epsilon_{1k}\epsilon_{2l}), \\ 1 - h_b\left(\frac{\epsilon_{1k}\epsilon_{2l}}{1 - \epsilon_{1k} - \epsilon_{2l} + 2\epsilon_{1k}\epsilon_{2l}}\right) \end{matrix}\right)\right\}_{k=1 \ldots M, l=1 \ldots L} \bigcup \left\{\left(\begin{matrix} \omega_{1k}\omega_{2l}(\epsilon_{1k} + \epsilon_{2l} - 2\epsilon_{1k}\epsilon_{2l}), \\ \left(1 - h_b\left(\frac{\epsilon_{1k} - \epsilon_{1k}\epsilon_{2l}}{\epsilon_{1k} + \epsilon_{2l} - 2\epsilon_{1k}\epsilon_{2l}}\right)\right) \end{matrix}\right)\right\}_{k=1 \ldots M, l=1 \ldots L} \tag{26}$$

The first BISM channel may include M possible BSC channel components in its profile and the second BISM channel may include L possible BSC channel components in its profile. Equations 26 and 27 may specify the transformation of two BSC type channels after one step of polarization, thus successive polarization follows directly from those equations and all M*L combinations of the BSC components from both BISM channels. Once the mutual information profiles have been computed and successive polarization has been completed, the profile may provide a snapshot of the structure of the channel. In some examples a number of the set of polarized subchannels is the same as a number of bits in a transport block.

The mutual information profiles may be approximated based on a (possibly non-constant) bin size, as it may be beneficial to approximate the profile to utilize available computing power. Also, adjacent profile components may be merged if their mutual information values are within a prescribed tolerance bin interval in order to approximate the mutual information profile when the number of profile components is large. This may reduce the complexity of recursive computation and may be accomplished by grouping profile components into bin intervals. The probabilities of occurrence for all profile components grouped into the same bin are added together, and a merge results in a shorter profile.

Upgrade and downgrade bounds may also be found using binning. In one example, the spikes of probability mass are added together within a bin, and either the left end of a bin or the right end of a bin may be selected as the overall mutual information value of all the spikes in the bin. If the left edge of the bin is chosen across all bins, the overall channel is upgraded in terms of mutual information, i.e., the channel has less noise. If the right edge of the bin is chosen across all bins, the overall channel is downgraded in terms of mutual information, i.e., the channel has more noise. The true mutual information will lie somewhere in between the upgrade and downgrade approximations. Additionally or alternatively, UE 515 may generate a set of mutual information profiles corresponding to a set of polarized subchannels of the wireless channel based on the identified channel structure generated by either base station 505 or UE 515.

Thus, generating the set of mutual information profile parameters may include determining the mutual information profile parameters based on the mutual information bin pattern. A device may calculate an upper bound or a lower bound for a channel quality parameter by adjusting the mutual information bin pattern. In some examples the mutual information bin pattern is non-uniform. In some examples the mutual information bin pattern is based on a non-linear function. In some cases, a device may select a second mutual information bin pattern including fewer bins than the mutual information bin pattern based on computational speed. The device may, additionally or alternatively, calculate at least one mean parameter, variance parameter, or higher order error analysis parameter for a polarized subchannel of the set of polarized subchannels based on the set of mutual information profile parameters.

At block 535, rows from a polar generation matrix may be selected based on the generated mutual information profiles. Base station 505 may use the exact or approximate mutual information profile to choose a parity check matrix. A fraction of the sub-channels may remain partially polarized. The upgrade and downgrade procedure may provide useful bounds for the sub-channels of interest to aid in the selection of subchannel indices. The lower and upper bounds may provide an interval over which the true mutual information of each sub-channel lies, and sorting these intervals may be used to select the sub-channels.

In one example, the mutual information profiles may be used to compute the mean of the profile which is the ordinary mutual information value; these values may be sorted and the sub-channels with the highest mutual information values chosen to be the information transmission set of the polar code (i.e., selecting the k of n rows of the polarization matrix as shown above with respect to FIG. 4). In this example, the mutual information values may be used to obtain the generator matrix of the polar code given channel statistics.

In other examples, the mutual information profiles may provide a characterization of sub-channels beyond the mean, including the variance and higher order terms characterizing the sub-channels. These other examples, may also enable alternative approaches for obtaining the generator matrix. Additionally or alternatively, the UE 515 may select a plurality of polar transform sequences based on the set of mutual information profile parameters generated by either base station 505 or UE 515. The selected polar transform sequences may correspond to rows from the polar generation matrix.

At block 540, data may be encoded using the selected rows based on the selected rows of the polar generation matrix. For example, base station 505 may use the selected rows to derive a parity check matrix to use for encoding data. The encoding process may include parameters such as the polar code length n=2 and the code rate, amongst others. Additionally or alternatively, UE 515 may encode data using the rows of the polar generation matrix selected by either base station 505 or UE 515.

In some cases, the parity check matrix may be selected "on-the-fly" adaptively based on different channel statistics. That is, a device may select a first plurality of polar transform sequences based on a first channel structure for a wireless channel and then select a second plurality of polar transform sequences based on a second channel structure for the wireless channel, where the second channel structure is different from the first channel structure and the second plurality of polar transform sequences is different from the first plurality of polar transform sequences. In some examples, selecting the first plurality of polar transform sequences may be based on Monte Carlo sampling, density evolution, mutual information profiling, or sequence upgrading/downgrading instead of or in addition to using mutual information profiles. In some examples, selecting the second set of polar transform sequences includes utilizing the same method used for selecting the first set of polar transform sequences. In some examples, selecting the second set of polar transform sequences may include utilizing a different method. In some examples, selecting the second plurality of polar transform sequences may include updating the first set of polar transform sequences based the second channel structure.

At block 545, derived parity check matrix information may be exchanged between the base station 505 and UE 515. For example, either base station 505 or UE 515 may calculate a parity check matrix using, e.g., mutual information profiles, and then communicate that choice to the other device to ensure that both devices use the same encoding/decoding matrix. In some cases this may involve indicating the rows of a polar generation matrix to be used for a parity check matrix.

At block 550, the encoded data may be sent over the channel. In some cases, the base station 505 may transmit the encoded data to UE 515. Additionally or alternatively, UE 515 may transmit the block of information over the wireless channel based on the encoding to base station 505. At block 555, the received signal including the encoded data may be decoded. In one case, UE 515 may decode the received signal based on a received (or indicated) parity check matrix. The data may be decoded either using a successive cancellation decoding or a successive cancellation list decoding algorithm with better decoding performance. Additionally or alternatively, base station 505 may decode a signal received from UE 515.

A device may encode or decode a block of information based on the selected plurality of polar transform sequences. Both encoder and decoder may compute the ordering or ranking of the polar code sub-channel indices (i.e., the parity-check matrix of the polar code) "on-the-fly." The encoder and decoder may change or switch the parity-check matrix used for communication when appropriate. The mutual information profile method may be implemented as an algorithm in software or hardware for speed. In some examples, a number of the plurality of polar transform sequences is based on a code rate. In other examples, encoding or decoding the block of information includes encoding or decoding the block of information with the code rate. In some examples selecting the plurality of polar transform sequences includes selecting a plurality of rows of a polar transform matrix.

Although the above example depicts base station 505 and UE 515 as performing their respective steps, it should be noted that other configurations are possible. Any of the steps performed by base station 505 may also be performed by UE 515 and vice versa. Additionally, all of the steps or a portion of the steps may be performed by either UE 515 or base station 505 with alternative timing.

Figure 6:
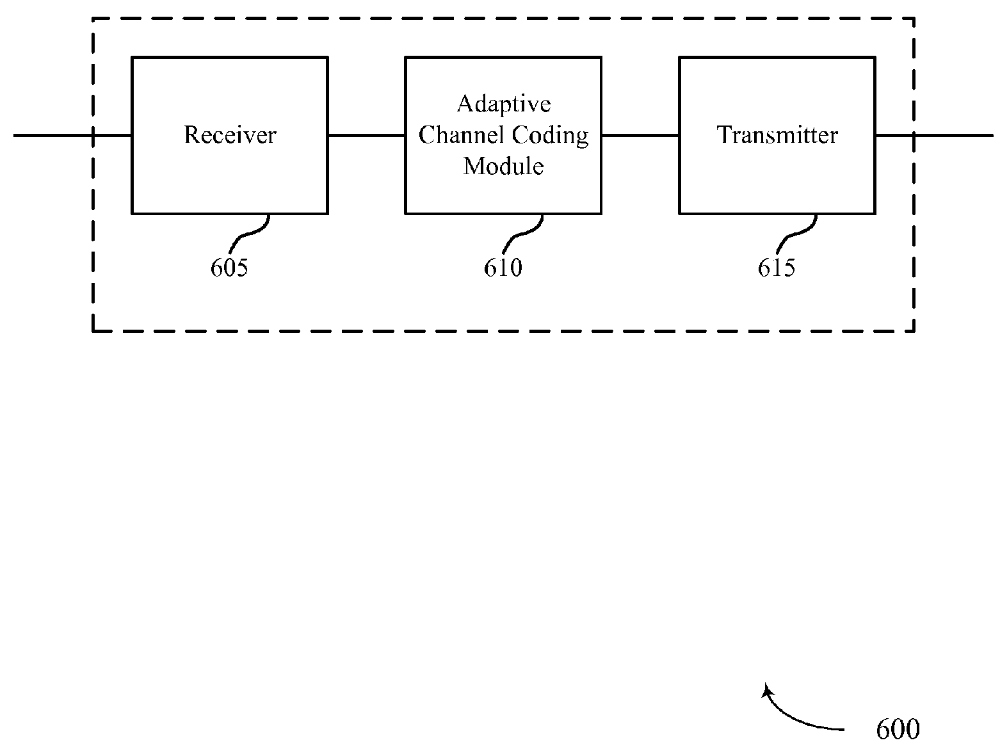
FIG. 6 shows a block diagram of a device configured for adaptive channel coding using polarization in accordance with various aspects of the present disclosure.

FIG. 6 shows a block diagram of a wireless device 600 configured for adaptive channel coding using polarization in accordance with various aspects of the present disclosure. Wireless device 600 may be an example of aspects of a UE or a base station described with reference to FIGS. 1-5. Wireless device 600 may include a receiver 605, an adaptive channel coding module 610, or a transmitter 615. Wireless device 600 may also include a processor. Each of these components may be in communication with each other.

The components of wireless device 600 may, individually or collectively, be implemented with at least one application specific integrated circuit (ASIC) adapted to perform some or all of the applicable functions in hardware. Alternatively, the functions may be performed by one or more other processing units (or cores), on at least one IC. In other examples, other types of integrated circuits may be used (e.g., Structured/Platform ASICs, a field programmable gate array (FPGA), or another semi-custom IC), which may be programmed in any manner known in the art. The functions of each unit may also be implemented, in whole or in part, with instructions embodied in a memory, formatted to be executed by one or more general or application-specific processors.

The receiver 605 may receive information such as packets, user data, or control information associated with various information channels (e.g., control channels, data channels, and information related to adaptive channel coding using polarization, etc.). Information may be passed on to the adaptive channel coding module 610, and to other components of wireless device 600. In some examples, the receiver 605 may receive an encoded block of data or an indication of a plurality of polar transform sequences based on a set of mutual information profile parameters corresponding to a wireless channel.

The adaptive channel coding module 610 may identify a channel structure for a wireless channel, generate a set of mutual information profile parameters corresponding to a set of polarized subchannels of the wireless channel based on the identified channel structure, select a plurality of polar transform sequences based on the set of mutual information profile parameters, and encode or decode a block of information based on the selected plurality of polar transform sequences.

The transmitter 615 may transmit signals received from other components of wireless device 600. In some examples, the transmitter 615 may be collocated with the receiver 605 in a transceiver module. The transmitter 615 may include a single antenna or a plurality of antennas. In some examples, the transmitter 615 may transmit the encoded block of information over the wireless channel. In some examples, the transmitter 615 may transmit a message including an indication of the plurality of polar transform sequences. In some examples, the transmitter 615 may transmit the block of information over the wireless channel based on the encoding.

Figure 7:
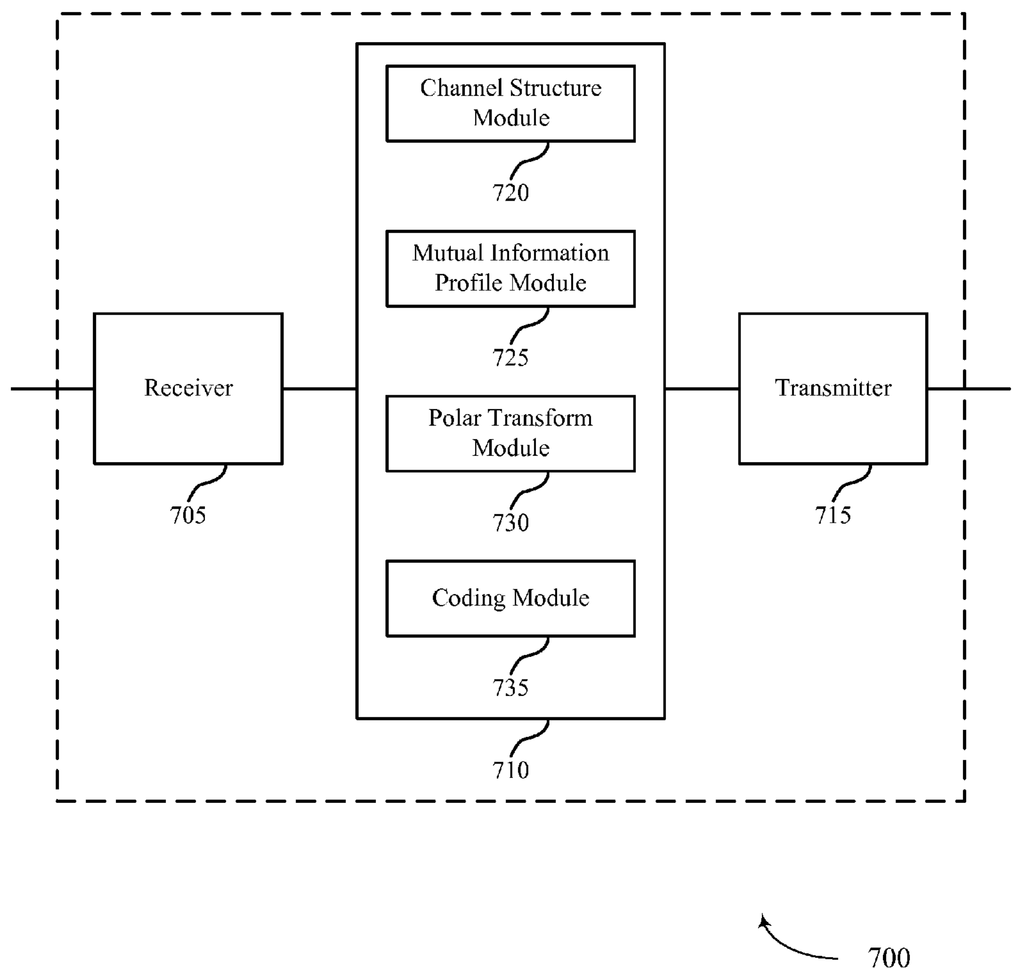
FIG. 7 shows a block diagram of a device configured for adaptive channel coding using polarization in accordance with various aspects of the present disclosure.

FIG. 7 shows a block diagram of a wireless device 700 for adaptive channel coding using polarization in accordance with various aspects of the present disclosure. Wireless device 700 may be an example of aspects of a wireless device 600, a base station 105, 205, 505, or a UE 115, 215, 515, as described with reference to FIGS. 1-6. Wireless device 700 may include a receiver 705, an adaptive channel coding module 710, or a transmitter 715. Wireless device 700 may also include a processor. Each of these components may be in communication with each other. The adaptive channel coding module 710 may also include a channel structure module 720, a mutual information profile module 725, a polar transform module 730, and a coding module 735.

The components of wireless device 700 may, individually or collectively, be implemented with at least one ASIC adapted to perform some or all of the applicable functions in hardware. Alternatively, the functions may be performed by one or more other processing units (or cores), on at least one IC. In other configurations, other types of integrated circuits may be used (e.g., Structured/Platform ASICs, an FPGA, or another semi-custom IC), which may be programmed in any manner known in the art. The functions of each unit may also be implemented, in whole or in part, with instructions embodied in a memory, formatted to be executed by one or more general or application-specific processors.

The receiver 705 may receive information which may be passed on to adaptive channel coding module 710, and to other components of wireless device 700. The adaptive channel coding module 710 may perform the operations described above with reference to FIG. 6. The transmitter 715 may transmit signals received from other components of wireless device 700.

The channel structure module 720 may identify a channel structure for a wireless channel as described above with reference to FIGS. 2-5. In some examples, the channel structure for the wireless channel includes a binary input symmetric memoryless (BISM) channel, a binary symmetric channel (BSC), a binary additive white Gaussian noise (B-AWGN) channel, or a binary erasure channel (BEC). In some examples, the channel structure includes a q-ary input channel or a MIMO channel.

The mutual information profile module 725 may generate a set of mutual information profile parameters corresponding to a set of polarized subchannels of the wireless channel based on the identified channel structure as described above with reference to FIGS. 2-5. In some examples, a number of the set of polarized subchannels may be the same as a number of bits in a transport block. The mutual information profile module 725 may also calculate at least one mean parameter, variance parameter, or higher order error analysis parameter for a polarized subchannel of the set of polarized subchannels based on the set of mutual information profile parameters.

The polar transform module 730 may select a plurality of polar transform sequences based on the set of mutual information profile parameters as described above with reference to FIGS. 2-5. In some examples, the number of the plurality of polar transform sequences may be based on a code rate. In some examples, selecting the plurality of polar transform sequences includes selecting a plurality of rows of a polar transform matrix. In some examples, selecting the first plurality of polar transform sequences includes utilizing Monte Carlo sampling, density evolution, mutual information profiling, or sequence upgrading/downgrading. The polar transform module 730 may also select a plurality of rows of a polar transform matrix based on an indication received from another wireless device.

The coding module 735 may encode or decode a block of information based on the selected plurality of polar transform sequences as described above with reference to FIGS. 2-5. In some examples, encoding or decoding the block of information includes encoding or decoding the block of information with the code rate. The coding module 735 may also encode or decode a second block of information based on the second plurality of polar transform sequences. The coding module 735 may also encode or decode a block of information based on a received indication of a plurality of polar transform sequences.

Figure 8:
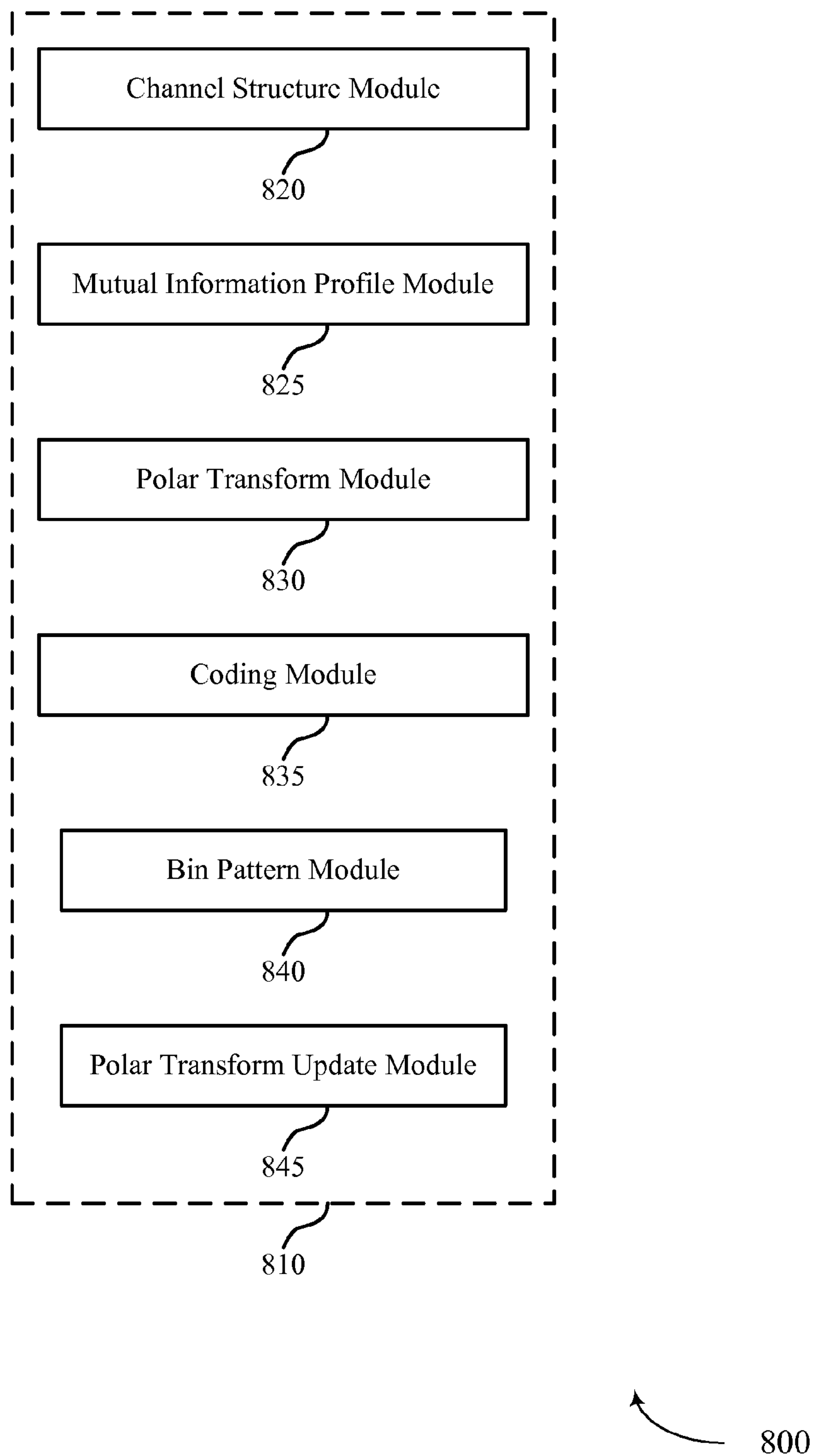
FIG. 8 shows a block diagram of an adaptive channel coding module configured for adaptive channel coding using polarization in accordance with various aspects of the present disclosure.

FIG. 8 shows a block diagram 800 of an adaptive channel coding module 810 which may be an example of an adaptive channel coding module 610 or 710, which may be a component of a wireless device 600 or a wireless device 700 in accordance with various aspects of the present disclosure. The adaptive channel coding module 810 may include a channel structure module 820, a mutual information profile module 825, a polar transform module 830, and a coding module 835. Each of these modules may perform the functions described above with reference to FIG. 7. The adaptive channel coding module 810 may also include a bin pattern module 840, and a polar transform update module 845.

The components of the adaptive channel coding module 810 may, individually or collectively, be implemented with at least one ASIC adapted to perform some or all of the applicable functions in hardware. Alternatively, the functions may be performed by one or more other processing units (or cores), on at least one IC. In other configurations, other types of integrated circuits may be used (e.g., Structured/Platform ASICs, an FPGA, or another semi-custom IC), which may be programmed in any manner known in the art. The functions of each unit may also be implemented, in whole or in part, with instructions embodied in a memory, formatted to be executed by one or more general or application-specific processors.

The bin pattern module 840 may select a mutual information bin pattern as described above with reference to FIGS. 2-5. In some examples, generating the set of mutual information profile parameters includes determining the mutual information profile parameters based on the mutual information bin pattern. The bin pattern module 840 may also be used to calculate an upper bound or a lower bound for a channel quality parameter by adjusting the mutual information bin pattern. In some examples, the mutual information bin pattern may be non-uniform. In some examples, the mutual information bin pattern may be based on a non-linear function such as an entropy function. The bin pattern module 840 may also select a second mutual information bin pattern including fewer bins than the mutual information bin pattern based on a computational speed.

The polar transform update module 845 may select a second plurality of polar transform sequences based on a second channel structure for the wireless channel, wherein the second channel structure is different from the first channel structure and the second plurality of polar transform sequences is different from the first plurality of polar transform sequences as described above with reference to FIGS. 2-5. In some examples, selecting the second plurality of polar transform sequences includes utilizing a same method used for selecting the first plurality of polar transform sequences. In some examples, selecting the second plurality of polar transform sequences includes utilizing a different method than for selecting the first plurality of polar transform sequences. In some examples, selecting the second plurality of polar transform sequences includes updating the first plurality of polar transform sequences based on identifying the second channel structure.

Figure 9:
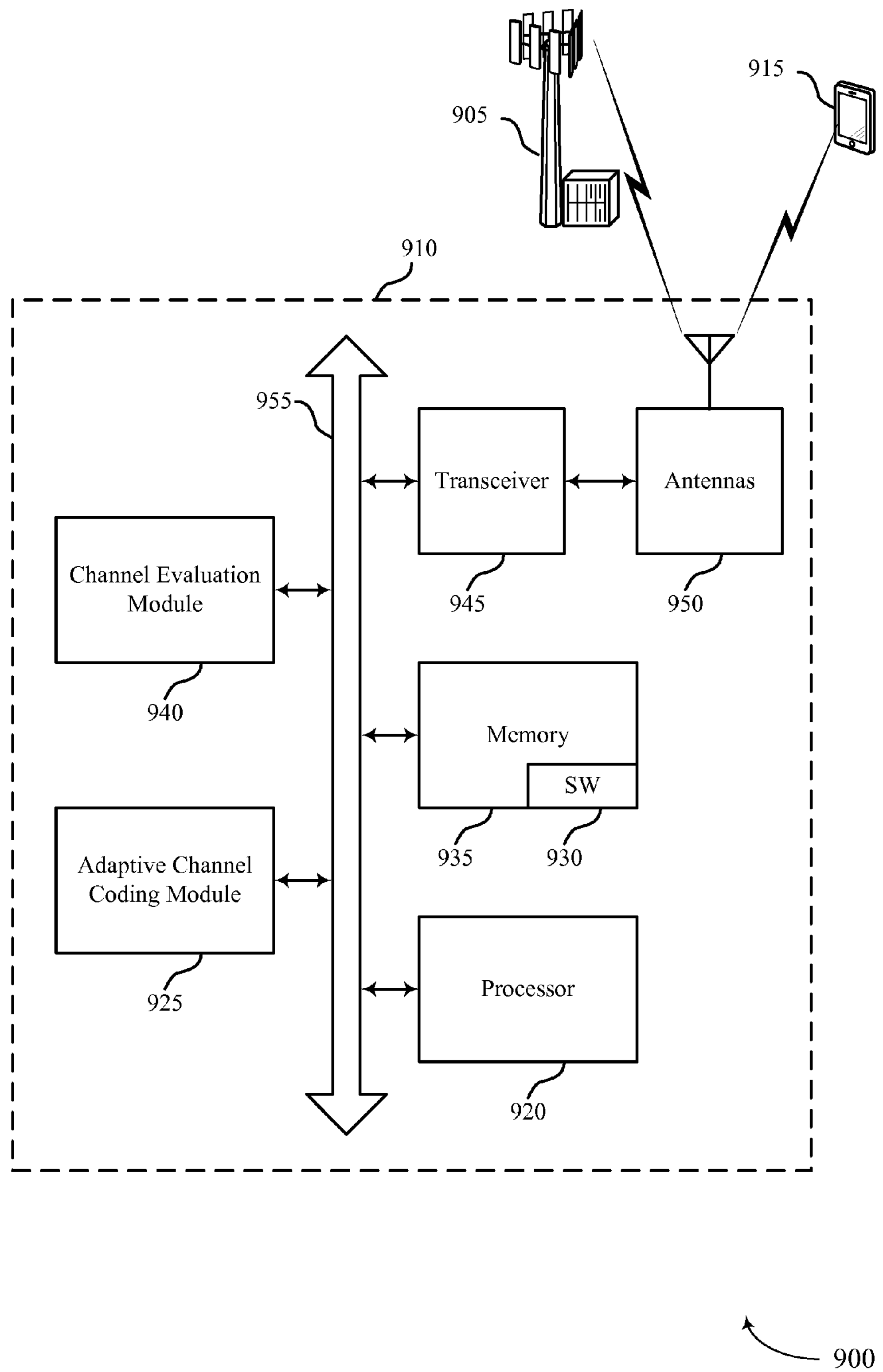
FIG. 9 illustrates a block diagram of a system including a device configured for adaptive channel coding using polarization in accordance with various aspects of the present disclosure.

FIG. 9 shows a diagram of a system 900 including a UE 910 configured for adaptive channel coding using polarization in accordance with various aspects of the present disclosure. System 900 may include UE 910, which may be an example of a wireless device 600, a wireless device 700, or a UE 115, 215, 505, as described above with reference to FIGS. 1, 2 and 6-8. UE 910 may include an adaptive channel coding module 925, which may be an example of an adaptive channel coding module 610, 710, and 810, described with reference to FIGS. 6-8. UE 910 may also include a channel evaluation module 940. UE 910 may include components for bi-directional voice and data communications including components for transmitting communications and components for receiving communications. For example, UE 910 may communicate bi-directionally with base station 905 or UE 915.

UE 910 may also include a processor 920, and memory 935 (including software (SW) 930), a transceiver 945, and one or more antenna(s) 950, each of which may communicate, directly or indirectly, with one another (e.g., via buses 955). The transceiver 945 may communicate bi-directionally, via the antenna(s) 950 or wired or wireless links, with one or more networks, as described above. For example, the transceiver 945 may communicate bi-directionally with a base station or another UE. The transceiver 945 may include a modem to modulate packets and provide the modulated packets to the antenna(s) 950 for transmission, and to demodulate packets received from the antenna(s) 950. While UE 910 may include a single antenna 950, UE 910 may also have multiple antennas 950 capable of concurrently transmitting or receiving multiple wireless transmissions.

The memory 935 may include random access memory (RAM) and read only memory (ROM). The memory 935 may store computer-readable, computer-executable software/firmware code 930 including instructions that, when executed, cause the processor 920 to perform various functions described herein (e.g., adaptive channel coding using polarization, etc.). Alternatively, the software/firmware code 930 may not be directly executable by the processor 920 but cause a computer (e.g., when compiled and executed) to perform functions described herein. The processor 920 may include an intelligent hardware device, (e.g., a central processing unit (CPU), a microcontroller, an ASIC, etc.)

Channel evaluation module 940 may determine a channel structure, which may include channel statistics, a channel matrix, and other aspects of a communication channel between a UE and a base station (or between multiple UEs).

Figure 10:
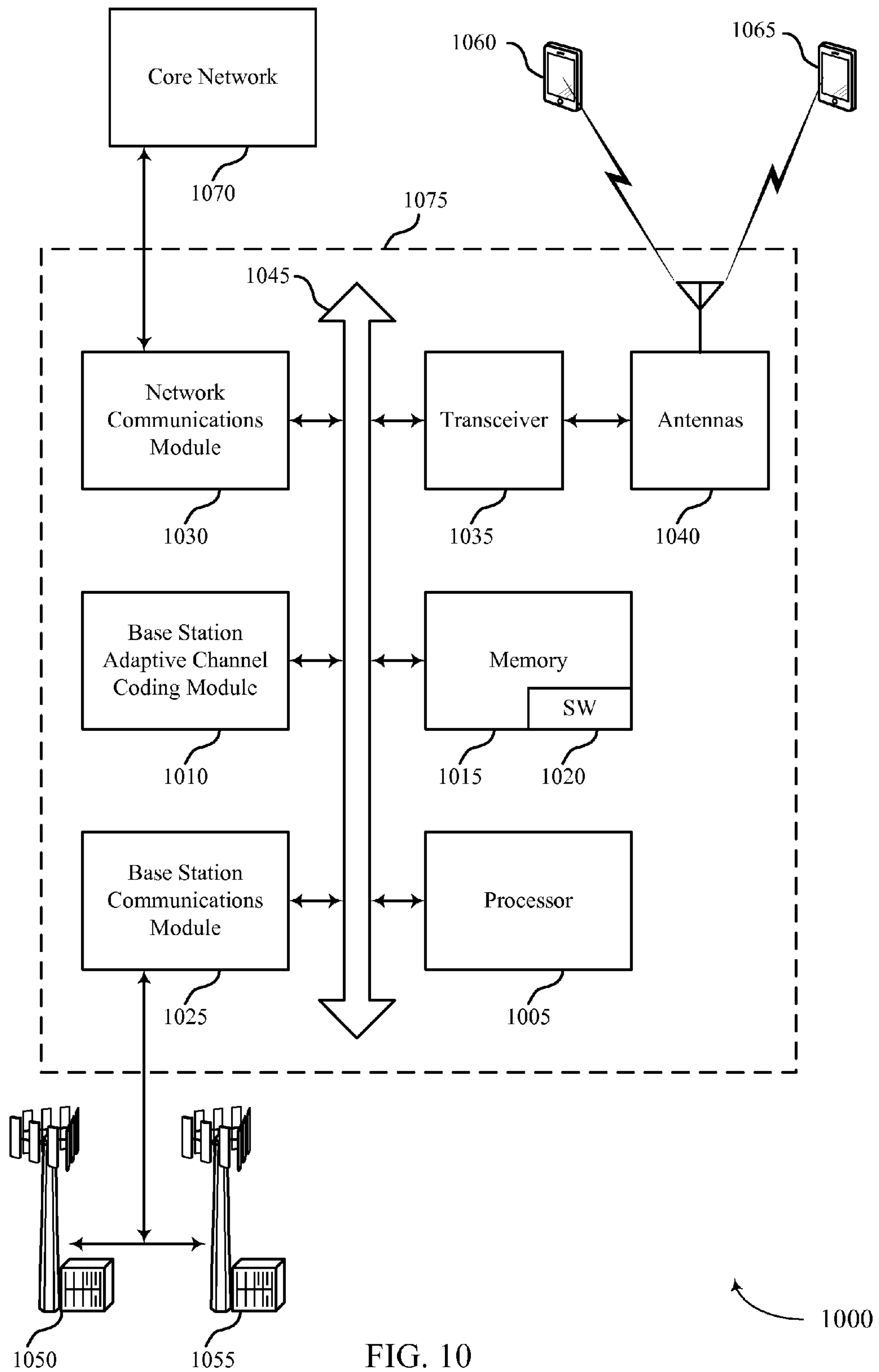
FIG. 10 illustrates a block diagram of a system including a base station configured for adaptive channel coding using polarization in accordance with various aspects of the present disclosure.

FIG. 10 shows a diagram of a system 1000 including a base station configured for adaptive channel coding using polarization in accordance with various aspects of the present disclosure. System 1000 may include base station 1075, which may be an example of a wireless device 600, a wireless device 700, or a base station 105, 205, 505, 905, described above with reference to FIGS. 1, 2 and 7-9. Base Station 1075 may include a base station adaptive channel coding module 1010, which may be an example of an adaptive channel coding module 610, 710 or 810 described with reference to FIGS. 7-9. Base Station 1075 may also include components for bi-directional voice and data communications including components for transmitting communications and components for receiving communications. For example, base station 1075 may communicate bi-directionally with base stations 1050 and 1055 and UEs 1060 and 1065.

In some cases, base station 1075 may have one or more wired backhaul links. Base station 1075 may have a wired backhaul link (e.g., 51 interface, etc.) to the core network 1070. Base station 1075 may also communicate with other base stations, such as base station 1050 and base station 1055 via inter-base station backhaul links (e.g., an X2 interface). Each of the base stations may communicate with UEs using the same or different wireless communications technologies. In some cases, base station 1075 may communicate with other base stations such as 1050 or 1055 utilizing base station communications module 1025. In some examples, base station communications module 1025 may provide an X2 interface within an LTE/LTE-A wireless communication network technology to provide communication between some of the base stations. In some examples, base station 1075 may communicate with other base stations through core network 1070. In some cases, base station 1075 may communicate with the core network 1070 through network communications module 1030.

The base station 1075 may include a processor 1005, memory 1015 (including software (SW) 1020), transceiver(s) 1035, and antenna(s) 1040, which each may be in communication, directly or indirectly, with one another (e.g., over bus system 1045). The transceiver(s) 1035 may be configured to communicate bi-directionally, via the antenna(s) 1040, with the UEs 1060, 1065, which may be multi-mode devices. The transceiver(s) 1035 (or other components of the base station 1075) may also be configured to communicate bi-directionally, via the antennas 1040, with one or more other base stations (not shown). The transceiver(s) 1035 may include a modem configured to modulate packets and provide the modulated packets to the antennas 1040 for transmission, and to demodulate packets received from the antennas 1040. The base station 1075 may include multiple transceivers 1035, each with one or more associated antennas 1040. The transceiver(s) 1035 may be an example of a combined receiver 605 and transmitter 615 of FIG. 6.

The memory 1015 may include RAM and ROM. The memory 1015 may also store computer-readable, computer-executable software code 1020 containing instructions that are configured to, when executed, cause the processor 1005 to perform various functions described herein (e.g., adaptive channel coding using polarization, selecting coverage enhancement techniques, call processing, database management, message routing, etc.). Alternatively, the software code 1020 may not be directly executable by the processor 1005 but be configured to cause the computer, e.g., when compiled and executed, to perform functions described herein. The processor 1005 may include an intelligent hardware device, e.g., a CPU, a microcontroller, an ASIC, etc. The processor 1005 may include various special purpose processors such as encoders, queue processing modules, base band processors, radio head controllers, digital signal processor (DSPs), and the like.

The base station communications module 1025 may manage communications with other base stations 1050, 1055. The base station communications module 1025 may include a controller or scheduler for controlling communications with UEs 1060, 1065 in cooperation with other base stations 1050, 1055. For example, the base station communications module 1025 may coordinate scheduling for transmissions to UEs 1060, 1065 for various interference mitigation techniques such as beamforming or joint transmission.

Figure 11:
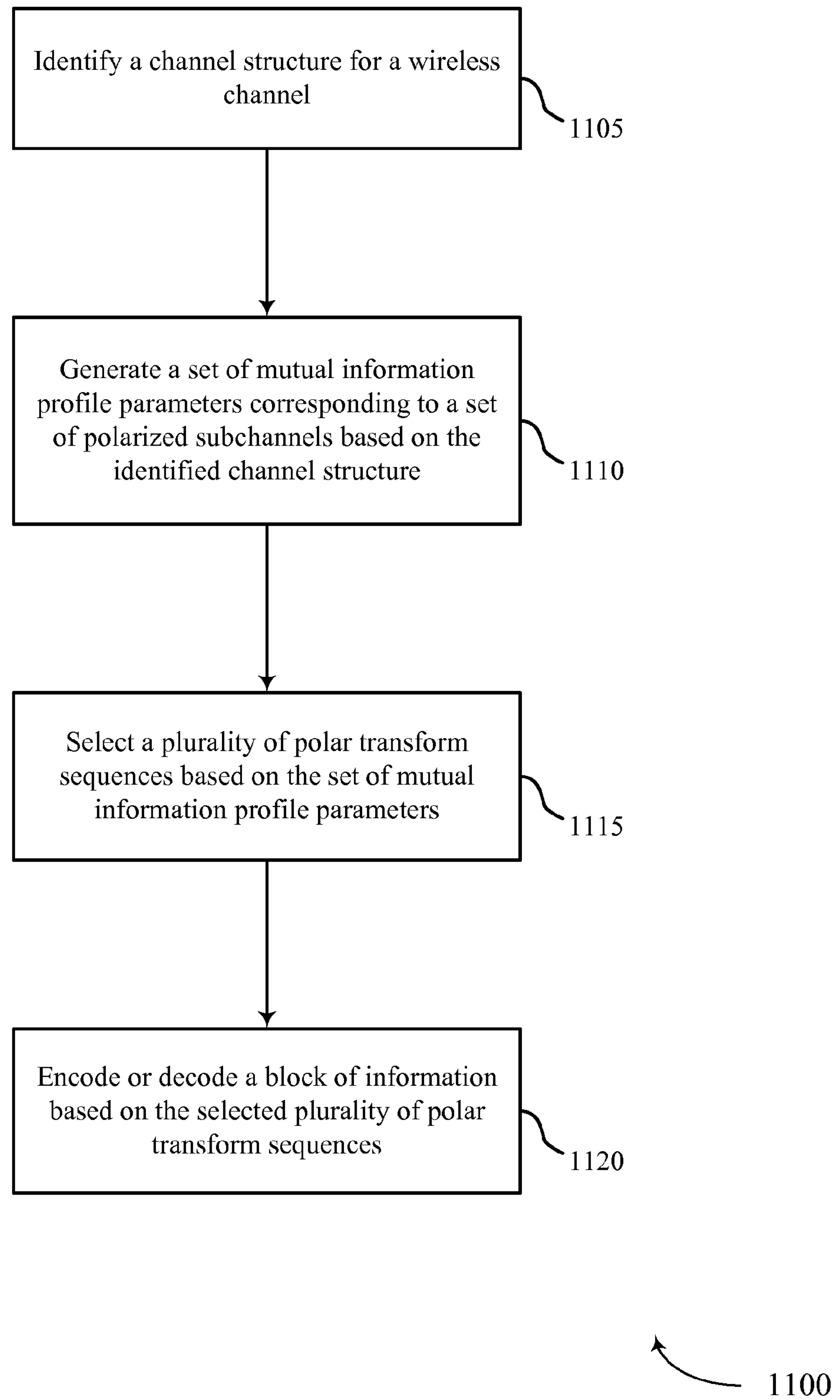
FIG. 11 shows a flowchart illustrating a method for adaptive channel coding using polarization in accordance with various aspects of the present disclosure.

FIG. 11 shows a flowchart illustrating a method 1100 for adaptive channel coding using polarization in accordance with various aspects of the present disclosure. The operations of method 1100 may be implemented by a wireless device or its components as described with reference to FIGS. 1-10. For example, the operations of method 1100 may be performed by a wireless device including an adaptive channel coding module 610, 710, 810, or 925 as described with reference to FIGS. 6-9. In some examples, a wireless device may execute a set of codes to control the functional elements of the wireless device to perform the functions described below. Additionally or alternatively, the wireless device may perform aspects the functions described below using special-purpose hardware.

At block 1105, the wireless device may identify a channel structure for a wireless channel as described above with reference to FIGS. 2-5. In certain examples, the operations of block 1105 may be performed by the channel structure module 720 or 820 as described above with reference to FIG. 7 or 8.

At block 1110, the wireless device may generate a set of mutual information profile parameters corresponding to a set of polarized subchannels of the wireless channel based on the identified channel structure as described above with reference to FIGS. 2-5. In certain examples, the operations of block 1110 may be performed by the mutual information profile module 725 or 825 as described above with reference to FIG. 7 or 8.

At block 1115, the wireless device may select a plurality of polar transform sequences based on the set of mutual information profile parameters as described above with reference to FIGS. 2-5. In certain examples, the operations of block 1115 may be performed by the polar transform module 730 or 830 as described above with reference to FIG. 7 or 8.

At block 1120, the wireless device may encode or decode a block of information based on the selected plurality of polar transform sequences as described above with reference to FIGS. 2-5. In certain examples, the operations of block 1120 may be performed by the coding module 735 or 835 as described above with reference to FIG. 7 or 8.

Figure 12:
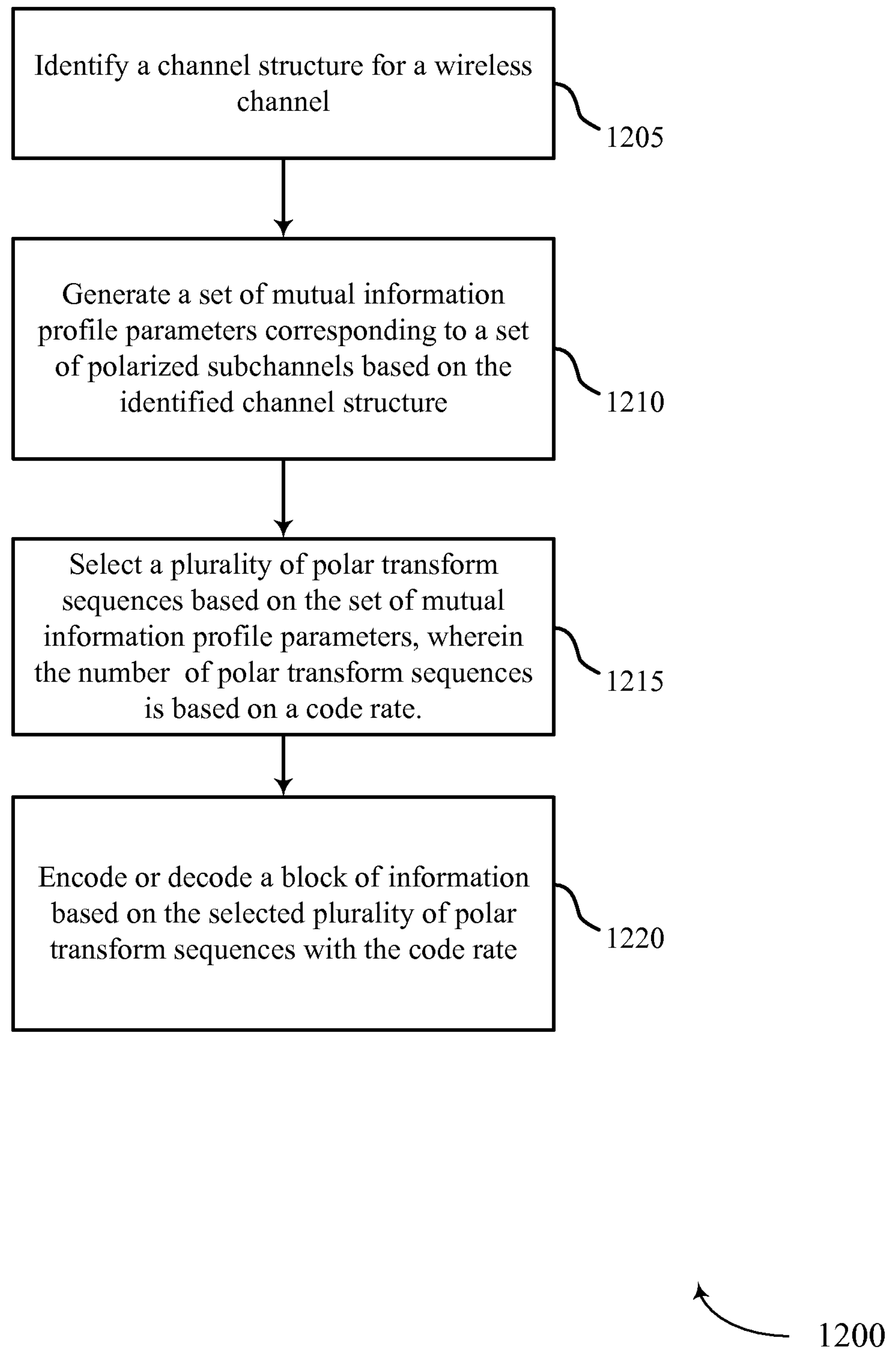
FIG. 12 shows a flowchart illustrating a method for adaptive channel coding using polarization in accordance with various aspects of the present disclosure.

FIG. 12 shows a flowchart illustrating a method 1200 for adaptive channel coding using polarization in accordance with various aspects of the present disclosure. The operations of method 1200 may be implemented by a wireless device or its components as described with reference to FIGS. 1-10. For example, the operations of method 1200 may be performed by the adaptive channel coding module 610, 710, 810, or 925 as described with reference to FIGS. 6-9. In some examples, a wireless device may execute a set of codes to control the functional elements of the wireless device to perform the functions described below. Additionally or alternatively, the wireless device may perform aspects the functions described below using special-purpose hardware. The method 1200 may also incorporate aspects of method 1100 of FIG. 11.

At block 1205, the wireless device may identify a channel structure for a wireless channel as described above with reference to FIGS. 2-5. In certain examples, the operations of block 1205 may be performed by the channel structure module 720 or 820 as described above with reference to FIG. 7 or 8.

At block 1210, the wireless device may generate a set of mutual information profile parameters corresponding to a set of polarized subchannels of the wireless channel based on the identified channel structure as described above with reference to FIGS. 2-5. In certain examples, the operations of block 1210 may be performed by the mutual information profile module 725 or 825 as described above with reference to FIG. 7 or 8.

At block 1215, the wireless device may select a plurality of polar transform sequences based on the set of mutual information profile parameters as described above with reference to FIGS. 2-5. In some cases, a number of the plurality of polar transform sequences is based on a code rate. In certain examples, the operations of block 1215 may be performed by the polar transform module 730 or 830 as described above with reference to FIG. 7 or 8.

At block 1220, the wireless device may encode or decode a block of information based on the selected plurality of polar transform sequences as described above with reference to FIGS. 2-5. In some cases, encoding or decoding the block of information includes encoding or decoding the block of information with the code rate. In certain examples, the operations of block 1220 may be performed by the coding module 735 or 835 as described above with reference to FIG. 7 or 8.

Figure 13:
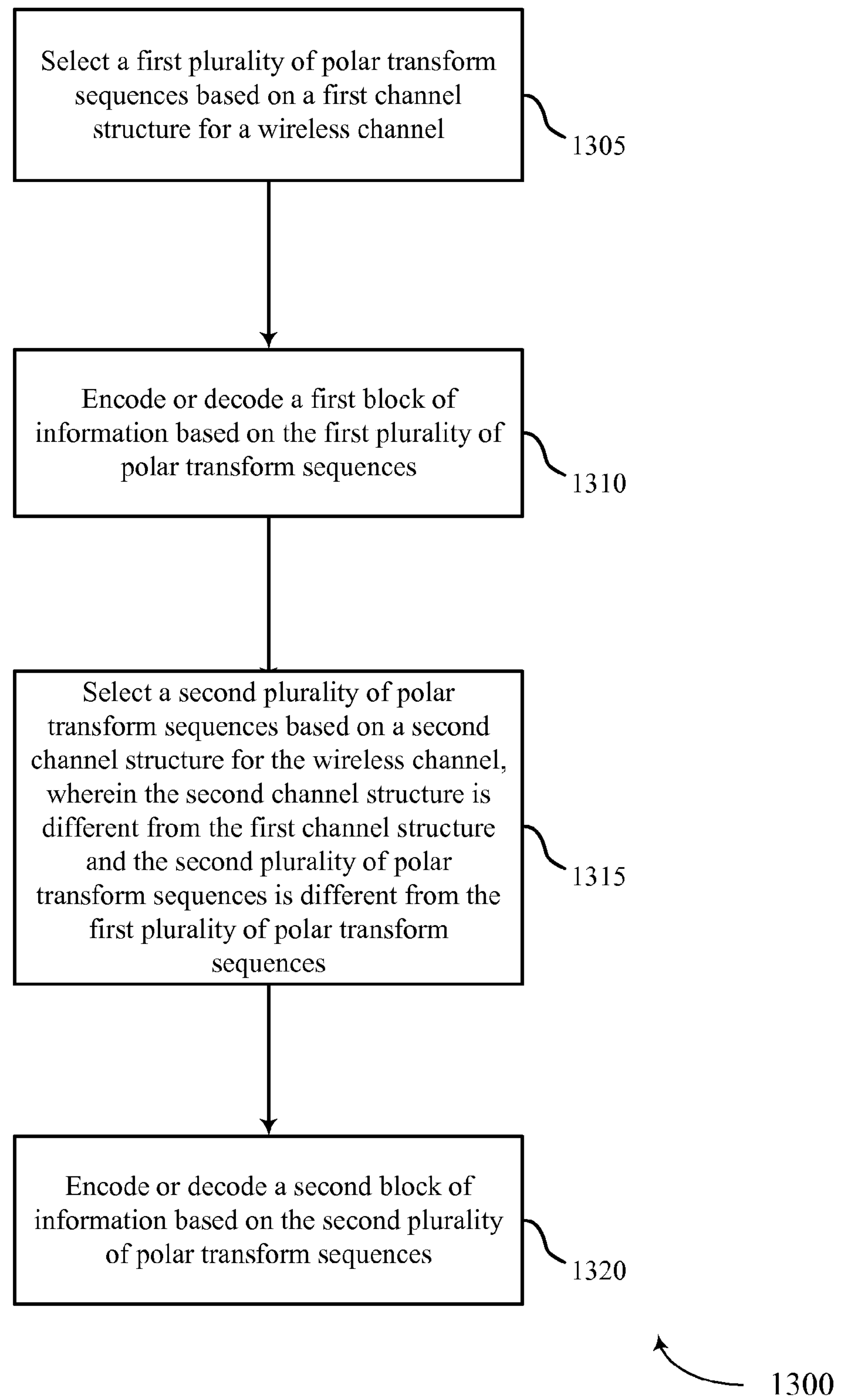
FIG. 13 shows a flowchart illustrating a method for adaptive channel coding using polarization in accordance with various aspects of the present disclosure.

FIG. 13 shows a flowchart illustrating a method 1300 for adaptive channel coding using polarization in accordance with various aspects of the present disclosure. The operations of method 1300 may be implemented by a wireless device or its components as described with reference to FIGS. 1-10. For example, the operations of method 1300 may be performed by the adaptive channel coding module 610, 710, 810, or 925 as described with reference to FIGS. 6-9. In some examples, a wireless device may execute a set of codes to control the functional elements of the wireless device to perform the functions described below. Additionally or alternatively, the wireless device may perform aspects the functions described below using special-purpose hardware. The method 1300 may also incorporate aspects of methods 1100, and 1200 of FIGS. 11-12.

At block 1305, the wireless device may select a first plurality of polar transform sequences based on a first channel structure for a wireless channel as described above with reference to FIGS. 2-5. In certain examples, the operations of block 1305 may be performed by the polar transform module 730 or 830 as described above with reference to FIG. 7 or 8.

At block 1310, the wireless device may encode or decode a first block of information based on the first plurality of polar transform sequences as described above with reference to FIGS. 2-5. In certain examples, the operations of block 1310 may be performed by the coding module 735 or 835 as described above with reference to FIG. 7 or 8.

At block 1315, the wireless device may select a second plurality of polar transform sequences based on a second channel structure for the wireless channel, wherein the second channel structure is different from the first channel structure and the second plurality of polar transform sequences is different from the first plurality of polar transform sequences as described above with reference to FIGS. 2-5. In certain examples, the operations of block 1315 may be performed by the polar transform update module 845 as described above with reference to FIG. 8.

At block 1320, the wireless device may encode or decode a second block of information based on the second plurality of polar transform sequences as described above with reference to FIGS. 2-5. In certain examples, the operations of block 1320 may be performed by the coding module 735 or 835 as described above with reference to FIG. 7 or 8.

Figure 14:
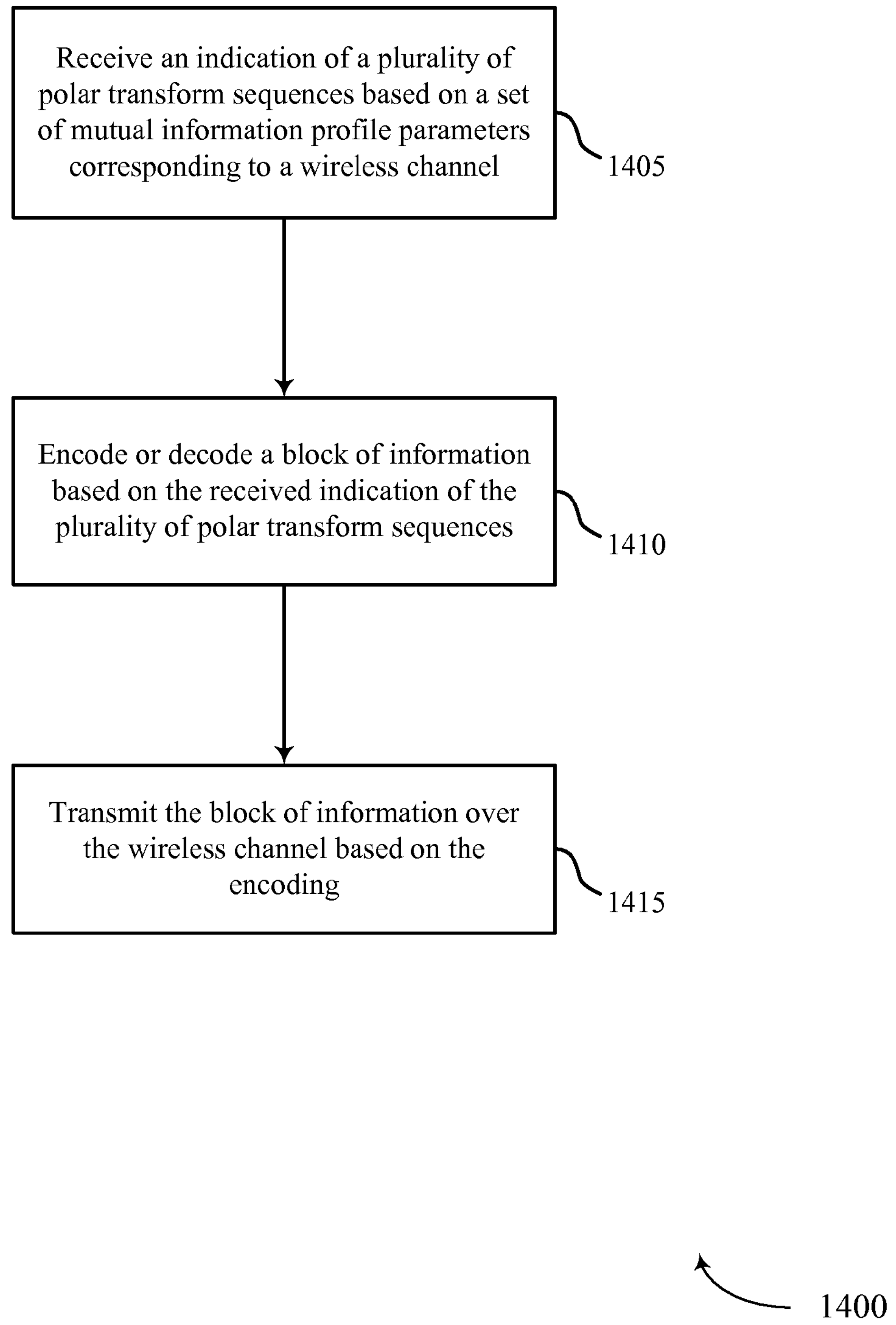
FIG. 14 shows a flowchart illustrating a method for adaptive channel coding using polarization in accordance with various aspects of the present disclosure.

FIG. 14 shows a flowchart illustrating a method 1400 for adaptive channel coding using polarization in accordance with various aspects of the present disclosure. The operations of method 1400 may be implemented by a wireless device or its components as described with reference to FIGS. 1-10. For example, the operations of method 1400 may be performed by the adaptive channel coding module 610, 710, 810, or 925 as described with reference to FIGS. 6-9. In some examples, a wireless device may execute a set of codes to control the functional elements of the wireless device to perform the functions described below. Additionally or alternatively, the wireless device may perform aspects the functions described below using special-purpose hardware. The method 1400 may also incorporate aspects of methods 1100, 1200, and 1300 of FIGS. 11-13.

At block 1405, the wireless device may receive an indication of a plurality of polar transform sequences based on a set of mutual information profile parameters corresponding to a wireless channel as described above with reference to FIGS. 2-5. In certain examples, the operations of block 1405 may be performed by the receiver 605 or 705 as described above with reference to FIG. 6 or 7.

At block 1410, the wireless device may encode or decode a block of information based on the received indication of the plurality of polar transform sequences as described above with reference to FIGS. 2-5. In certain examples, the operations of block 1410 may be performed by the coding module 735 or 835 as described above with reference to FIG. 7 or 8.

At block 1415, the wireless device may transmit the block of information over the wireless channel based on the encoding as described above with reference to FIGS. 2-5. In certain examples, the operations of block 1415 may be performed by the transmitter 615 or 715 as described above with reference to FIG. 6 or 7.

Thus, methods 1100, 1200, 1300, and 1400 may provide for adaptive channel coding using polarization. It should be noted that methods 1100, 1200, 1300, and 1400 describe possible implementation, and that the operations and the steps may be rearranged or otherwise modified such that other implementations are possible. In some examples, aspects from two or more of the methods 1100, 1200, 1300, and 1400 may be combined.

The detailed description set forth above in connection with the appended drawings describes exemplary configurations and does not represent all the configurations that may be implemented or that are within the scope of the claims. The term "example" or "exemplary" when used in this description means "serving as an example, instance, or illustration," and not "preferred" or "advantageous over other configurations." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of [at least one of A, B, or C] means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can include RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

Techniques described herein may be used for various wireless communications systems such as code division multiple access (CDMA), time division multiple access (TDMA), frequency division multiplexing (FDM)A, orthogonal frequency division multiple access (OFDMA), single carrier frequency division multiple access (SC-FDMA), and other systems. The terms "system" and "network" are often used interchangeably. A CDMA system may implement a radio technology such as CDMA2000, Universal Terrestrial Radio Access (UTRA), etc. CDMA2000 covers IS-2000, IS-95, and IS-856 standards. IS-2000 Releases 0 and A are commonly referred to as CDMA2000 1×, 1×, etc. IS-856 (TIA-856) is commonly referred to as CDMA2000 1×EV-DO, High Rate Packet Data (HRPD), etc. UTRA includes Wideband CDMA (WCDMA) and other variants of CDMA. A TDMA system may implement a radio technology such as Global System for Mobile Communications (GSM). An OFDMA system may implement a radio technology such as Ultra Mobile Broadband (UMB), Evolved UTRA (E-UTRA), IEEE 802.11 (Wi-Fi), IEEE 802.16 (WiMAX), IEEE 802.20, Flash-OFDM, etc. UTRA and E-UTRA are part of Universal Mobile Telecommunications system (UMTS). 3GPP Long Term Evolution (LTE) and LTE-Advanced (LTE-A) are new releases of Universal Mobile Telecommunications System (UMTS) that use E-UTRA. UTRA, E-UTRA, UMTS, LTE, LTE-A, and Global System for Mobile communications (GSM) are described in documents from an organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. The description above, however, describes an LTE system for purposes of example, and LTE terminology is used in much of the description above, although the techniques are applicable beyond LTE applications.

APPENDIX A

Transform to a Minus (−) Channel

Algorithm simple-transform-minus

Input: $0 \le w_1 \le 1,\ 0 \le w_2 \le 1,\ 0 \le e_1 \le \frac{1}{2},\ 0 \le e_2 \le \frac{1}{2}.$ Output: list-w, list-e.

list-w = {}
list-e = {}
$w_{new} \Leftarrow w_1 w_2$
list-w.add($w_{new}$)
if ($e_1 = 0$ and $e_2 = 0$) then
  $e_{new} \Leftarrow 0$
else if ($e_1 = 0$ or $e_2 = 0$) then
  $e_{new} \Leftarrow \max(e_1, e_2)$
else if $\left(e_1 = \frac{1}{2} \text{ or } e_2 = \frac{1}{2}\right)$ then
  $e_{new} \Leftarrow \frac{1}{2}$
else
  $e_{new} \Leftarrow e_1 + e_2 - 2e_1e_2$
end if
list-e.add($e_{new}$)
return list-w, list-e

APPENDIX B

Transform to a Plus (+) Channel

Algorithm simple-transform-plus

Input: $0 \le w_1 \le 1,\ 0 \le w_2 \le 1,\ 0 \le e_1 \le \frac{1}{2},\ 0 \le e_2 \le \frac{1}{2}.$ Output: list-w, list-e.

list-w = {}
list-e = {}
if ($e_1 = 0$ and $e_2 = 0$) then
  list-w.add($w_1w_2$)
  list-e.add(0)
else if $\left(e_1 = \frac{1}{2} \text{ or } e_2 = \frac{1}{2}\right)$ then
  list-w.add($w_1w_2$)
  list-e.add$\left(\frac{1}{2}\right)$
else if $\left(e_1 = \frac{1}{2} \text{ or } e_2 = \frac{1}{2}\right)$ then
  list-w.add($w_1w_2$)
  list-e.add(min($e_1$,$e_2$))
else
  temp $\Leftarrow e_1 + e_2 - 2e_1e_2$
  list-w.add($w_1w_2(1 - \text{temp})$)
  list-w.add($w_1w_2(\text{tamp})$)
  $e_{new,1} \Leftarrow \frac{e_1e_2}{1 - e_1 - e_2 + 2e_1e_2}$
  $e_{new,2} \Leftarrow \frac{e_1 - e_1e_2}{e_1 + e_2 - 2e_1e_2}$
  if $e_{new,1} > \frac{1}{2}$ then
    $e_{new,1} \Leftarrow 1 - e_{new,1}$
  end if
  if $e_{new,2} > \frac{1}{2}$ then
    $e_{new,2} \Leftarrow 1 - e_{new,2}$
  end if
  list-e.add($e_{new,1}$)
  list-e.add($e_{new,2}$)
end if
return list-w, list-e

APPENDIX C

Multi-Component Transform
Algorithm multi-comp-transform

Input: Channel Description: list-w, list-e, length(list-w) = length(list-e).
  Binary value: $b \in \{0, 1\}$ indicating one-step polarization.
Output: list-w-new, list-e-new.

list-w-new = { }
list-e-new = { }
for k = 0 to k = length(list-w) − 1 do
  for r = 0 to r = length(list-w) − 1 do
    $w_1 \Leftarrow$ list-w[k]
    $e_1 \Leftarrow$ list-e[k]
    $w_2 \Leftarrow$ list-w[r]
    $e_2 \Leftarrow$ list-e[r]
    if (b = 0) then
      list-w-temp, list-e-temp = simple-transforrn-minus($w_1$, $w_2$, $e_1$, $e_2$)
      list-w-new.append(list-w-temp)
      list-e-new.append(list-e-temp)
    else
      list-w-temp, list-e-temp = simple-transform-plus($w_1$, $w_2$, $e_1$, $e_2$)
      list-w-new.append(list-w-temp)
      list-e-new.append(list-e-temp)
    end if
  end for
end for
return list-w-new, list-e-new

APPENDIX D

Exact MIP for a Polar Subchannel
Algorithm compute-exact-MIP- for-polar-subchannel

```
Input: Channel Description: list-w, list-e, length(list-w) = length(list-e).
    Binary index of polarized subchannel: b1b2 ... bℓ, ℓ ≥ 1, indicating ℓ-step
    polarization.
Output: list-w-new, list-e-new.
 1: list-w-new = { }
 2: list-e-new = { }
 3: list-w-new.append(list-w)
 4: list-e-new.append(list-e)
 5: for i = 1 to i = ℓ do
 6:     list-w-temp, list-e-temp =
            multi-comp-transform(list-w-new, list-e-new, bi)
 7:     list-w-new ⇐ list-w-temp
 8:     list-e-new ⇐ list-e-temp
 9: end for
10: return list-w-new, list-e-new
```

What is claimed is:

1. A method for wireless communications at a wireless device, comprising:

identifying a channel structure and channel conditions for a wireless channel;

generating a set of mutual information profile parameters corresponding to a set of polarized subchannels of the wireless channel based at least in part on the identified channel structure and the identified channel conditions;

selecting a plurality of polar transform sequences based at least in part on the set of mutual information profile parameters; and transmitting or receiving, by the wireless device, a block of information based at least in part on the selected plurality of polar transform sequences.

2. The method of claim 1, wherein selecting the plurality of polar transform sequences comprises:

selecting a plurality of rows of a polar transform matrix.

3. The method of claim 1, further comprising:

selecting a mutual information bin pattern; and wherein generating the set of mutual information profile parameters comprises:

determining the mutual information profile parameters based at least in part on the mutual information bin pattern.

4. The method of claim 3, further comprising:

calculating an upper bound or a lower bound for a channel quality parameter by adjusting the mutual information bin pattern.

5. The method of claim 3, wherein the mutual information bin pattern is non-uniform.

6. The method of claim 5, wherein the mutual information bin pattern is based at least in part on a non-linear function.

7. The method of claim 3, further comprising:

selecting a second mutual information bin pattern including fewer bins than the mutual information bin pattern based at least in part on a computational speed.

8. The method of claim 1, further comprising:

transmitting a message comprising an indication of the plurality of polar transform sequences.

9. The method of claim 1, wherein a number of the set of polarized subchannels is equal to a number of bits in a transport block.

10. The method of claim 1, wherein the channel structure comprises a q-ary input channel or a multiple input multiple output (MIMO) channel.

11. The method of claim 1, further comprising:

calculating at least one mean parameter, variance parameter, or higher order error analysis parameter for a polarized subchannel of the set of polarized subchannels based at least in part on the set of mutual information profile parameters.

12. The method of claim 1, wherein the transmitting or receiving further comprises:

encoding or decoding the block of information based at least in part on the selected plurality of polar transform sequences.

13. The method of claim 12, wherein a number of the plurality of polar transform sequences is based at least in part on a code rate; and wherein encoding or decoding the block of information comprises:

encoding or decoding the block of information with the code rate.

14. A method for wireless communications at a wireless device, comprising:

receiving an indication of a plurality of polar transform sequences based at least in part on a set of mutual information profile parameters corresponding to a wireless channel;

encoding or decoding a block of information based at least in part on the received indication of the plurality of polar transform sequences; and transmitting, by the wireless device, the block of information over the wireless channel based at least in part on the encoding.

15. The method of claim 14, further comprising:

selecting a plurality of rows of a polar transform matrix based at least in part on the indication, wherein encoding the block of information is based at least in part on the selected plurality of rows.

16. An apparatus for wireless communications at a wireless device, comprising:

a processor; and memory coupled to the processor, wherein the processor is configured to:

identify a channel structure and channel conditions for a wireless channel;

generate a set of mutual information profile parameters corresponding to a set of polarized subchannels of the wireless channel based at least in part on the identified channel structure and the identified channel conditions;

select a plurality of polar transform sequences based at least in part on the set of mutual information profile parameters; and transmit or receive, by the wireless device, a block of information based at least in part on the selected plurality of polar transform sequences.

17. The apparatus of claim 16, wherein the processor configured to select the plurality of polar transform sequences comprises the processor configured to:

select a plurality of rows of a polar transform matrix.

18. The apparatus of claim 16, wherein the processor is configured to:

select a mutual information bin pattern; and wherein the processor configured to generate the set of mutual information profile parameters comprises the processor configured to:

determine the mutual information profile parameters based at least in part on the mutual information bin pattern.

19. The apparatus of claim 18, wherein the processor is configured to:

calculate an upper bound or a lower bound for a channel quality parameter by adjusting the mutual information bin pattern.

20. The apparatus of claim 18, wherein the mutual information bin pattern is non-uniform.

21. The apparatus of claim 20, wherein the mutual information bin pattern is based at least in part on a non-linear function.

22. The apparatus of claim 18, wherein the processor is configured to:

select a second mutual information bin pattern including fewer bins than the mutual information bin pattern based at least in part on a computational speed.

23. The apparatus of claim 16, wherein the processor is configured to:

transmit a message comprising an indication of the plurality of polar transform sequences.

24. The apparatus of claim 16, wherein a number of the set of polarized subchannels is equal to a number of bits in a transport block.

25. The apparatus of claim 16, wherein the channel structure comprises a q-ary input channel or a multiple input multiple output (MIMO) channel.

26. The apparatus of claim 16, wherein the processor is configured to:

calculate at least one mean parameter, variance parameter, or higher order error analysis parameter for a polarized subchannel of the set of polarized subchannels based at least in part on the set of mutual information profile parameters.

27. The method of claim 16, wherein the processor configured to transmit or receive comprises the processor configured to:

encode or decode the block of information based at least in part on the selected plurality of polar transform sequences.

28. The apparatus of claim 27, wherein a number of the plurality of polar transform sequences is based at least in part on a code rate; and wherein encoding or decoding the block of information comprises:

encoding or decoding the block of information with the code rate.

29. An apparatus for wireless communications at a wireless device, comprising:

a processor; and memory coupled to the processor, wherein the processor is configured to:

receive an indication of a plurality of polar transform sequences based at least in part on a set of mutual information profile parameters corresponding to a wireless channel;

encode or decode a block of information based at least in part on the received indication of the plurality of polar transform sequences; and transmit, by the wireless device, the block of information over the wireless channel based at least in part on the encoding.

30. The apparatus of claim 29, wherein the processor is configured to:

select a plurality of rows of a polar transform matrix based at least in part on the indication, wherein encoding the block of information is based at least in part on the selected plurality of rows.

* * * * *